(12) United States Patent
Sukegawa et al.

(10) Patent No.: US 11,889,218 B2
(45) Date of Patent: Jan. 30, 2024

(54) STACKED SUBSTRATE SOLID STATE IMAGE SENSOR

(71) Applicant: Sony Group Corporation, Tokyo (JP)

(72) Inventors: Shunichi Sukegawa, Ibaraki (JP); Shunji Maeda, Tokyo (JP); Junichi Ishibashi, Saitama (JP); Motoshige Okada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 17/471,634

(22) Filed: Sep. 10, 2021

(65) Prior Publication Data

US 2021/0409621 A1 Dec. 30, 2021

Related U.S. Application Data

(63) Continuation of application No. 15/567,202, filed as application No. PCT/JP2016/054925 on Feb. 19, 2016, now Pat. No. 11,153,515.

(30) Foreign Application Priority Data

Apr. 24, 2015 (JP) ................................. 2015-088992

(51) Int. Cl.
*H04N 25/772* (2023.01)
*H01L 27/146* (2006.01)
(Continued)

(52) U.S. Cl.
CPC ........... *H04N 25/772* (2023.01); *H01L 27/14* (2013.01); *H01L 27/146* (2013.01);
(Continued)

(58) Field of Classification Search
CPC .. H04N 5/3355; H04N 5/23241; H04N 5/369; H04N 5/374; H04N 5/37455;
(Continued)

(56) References Cited

U.S. PATENT DOCUMENTS 10,554,910 B2 2/2020 Sukegawa et al.
2002/0105493 A1 8/2002 Komiya
(Continued)

FOREIGN PATENT DOCUMENTS

CN 101228631 A 7/2008
CN 101304470 A 11/2008
(Continued)

OTHER PUBLICATIONS

U.S. Appl. No. 15/567,202, filed Oct. 17, 2017, Sukegawa et al.
(Continued)

*Primary Examiner* — Twyler L Haskins
*Assistant Examiner* — Akshay Trehan
(74) *Attorney, Agent, or Firm* — Wolf, Greenfield & Sacks, P.C.

(57) ABSTRACT

A solid state image sensor of the present disclosure includes: a first semiconductor substrate provided with at least a pixel array unit in which pixels that perform photoelectric conversion are arranged in a matrix form; and a second semiconductor substrate provided with at least a control circuit unit that drives the pixels. The first semiconductor substrate and the second semiconductor substrate are stacked, with first surfaces on which wiring layers are formed facing each other, the pixel array unit is composed of a plurality of divided array units, the control circuit unit is provided corresponding to each of the plurality of divided array units, and electrical connection is established in each of the divided array units, through an electrode located on each of the first surfaces of the first semiconductor substrate and the second semiconductor substrate, between the pixel array unit and the control circuit unit.

14 Claims, 18 Drawing Sheets

(51) Int. Cl.
| | |
|---|---|
| *H01L 27/14* | (2006.01) |
| *H04N 23/65* | (2023.01) |
| *H04N 25/70* | (2023.01) |
| *H04N 25/75* | (2023.01) |
| *H04N 25/76* | (2023.01) |
| *H04N 25/79* | (2023.01) |
| *H04N 25/71* | (2023.01) |
| *H04N 25/709* | (2023.01) |
| *G01S 17/10* | (2020.01) |

(52) U.S. Cl.
CPC .. *H01L 27/14603* (2013.01); *H01L 27/14609* (2013.01); *H01L 27/14634* (2013.01); *H01L 27/14636* (2013.01); *H01L 27/14643* (2013.01); *H01L 27/14645* (2013.01); *H04N 23/65* (2023.01); *H04N 25/70* (2023.01); *H04N 25/745* (2023.01); *H04N 25/75* (2023.01); *H04N 25/76* (2023.01); *H04N 25/79* (2023.01); *G01S 17/10* (2013.01); *H01L 27/1464* (2013.01); *H01L 27/14621* (2013.01); *H01L 27/14627* (2013.01); *H04N 25/709* (2023.01)

(58) Field of Classification Search
CPC ...... H04N 5/3765; H04N 5/378; H04N 5/379; H04N 5/3698; H04N 23/65; H04N 25/772; H04N 25/70; H04N 25/745; H04N 25/75; H04N 25/76; H04N 25/79; H04N 25/709; H01L 27/14; H01L 27/146; H01L 27/14603; H01L 27/14609; H01L 27/14634; H01L 27/14636; H01L 27/14643; H01L 27/14645; H01L 27/14621; H01L 27/14627; H01L 27/1464; G01S 17/10

See application file for complete search history.

(56) References Cited

U.S. PATENT DOCUMENTS

| | | |
|---|---|---|
| 2006/0220673 A1 | 10/2006 | Hiranuma et al. |
| 2008/0303931 A1 | 12/2008 | Taguchi et al. |
| 2009/0303931 A1 | 12/2009 | Yamauchi |
| 2010/0238331 A1 | 9/2010 | Umebayashi et al. |
| 2010/0276572 A1* | 11/2010 | Iwabuchi ............... H04N 23/54 257/443 |
| 2011/0102656 A1 | 5/2011 | Hatano et al. |
| 2012/0001615 A1 | 1/2012 | Levine |
| 2012/0307030 A1* | 12/2012 | Blanquart ........... H01L 27/1464 348/76 |
| 2013/0033632 A1* | 2/2013 | Kishi ..................... H04N 25/75 348/308 |
| 2013/0068929 A1* | 3/2013 | Solhusvik ............. H04N 25/75 250/208.1 |
| 2013/0087877 A1* | 4/2013 | Sakaguchi ........ H01L 27/14603 257/443 |
| 2013/0101176 A1* | 4/2013 | Park ....................... G01S 17/36 382/106 |
| 2013/0250062 A1* | 9/2013 | Tin ....................... H04N 13/122 348/46 |
| 2014/0077063 A1* | 3/2014 | Cho .................. H01L 27/14618 257/443 |
| 2014/0146208 A1* | 5/2014 | Nakajima ............. H04N 25/79 348/294 |
| 2015/0146062 A1* | 5/2015 | Tanaka ................... H04N 25/75 348/302 |
| 2015/0163403 A1* | 6/2015 | Wakabayashi .... H01L 27/14643 348/308 |
| 2015/0229861 A1* | 8/2015 | Yakemoto ......... H01L 27/14636 348/308 |
| 2015/0281613 A1* | 10/2015 | Vogelsang ........... H04N 25/772 348/300 |
| 2015/0288908 A1* | 10/2015 | Shen ................ H01L 27/14634 348/308 |
| 2016/0323523 A1* | 11/2016 | Chiang ................ H04N 25/745 |
| 2018/0109741 A1 | 4/2018 | Sukegawa et al. |
| 2018/0109750 A1 | 4/2018 | Sukegawa et al. |

FOREIGN PATENT DOCUMENTS

| | | | |
|---|---|---|---|
| CN | 101753866 A | 6/2010 | |
| CN | 102893597 A | 1/2013 | |
| CN | 103907133 A | 7/2014 | |
| CN | 104429057 A | 3/2015 | |
| EP | 2 871 835 A1 | 5/2015 | |
| JP | 2006-352426 A | 12/2006 | |
| JP | 2007-123403 A | 5/2007 | |
| JP | 2008-306695 A | 12/2008 | |
| JP | 2011-243862 A * | 1/2011 | ........... H01L 27/146 |
| JP | 2011-159958 A | 8/2011 | |
| JP | 2011-243862 A | 12/2011 | |
| KR | 20150004755 A | 1/2015 | |
| KR | 20150035722 A | 4/2015 | |
| WO | WO 2014/007004 A1 | 1/2014 | |

OTHER PUBLICATIONS

U.S. Appl. No. 15/831,559, filed Dec. 5, 2017, Sukegawa et al.
International Search Report and Written Opinion and English translation thereof dated May 10, 2016 in connection with International Application No. PCT/JP2016/054925.
International Preliminary Report on Patentability and English translation thereof dated Nov. 2, 2017 in connection with International Application No. PCT/JP2016/054925.

\* cited by examiner

STACKED SUBSTRATE SOLID STATE IMAGE SENSOR

CROSS-REFERENCE TO RELATED APPLICATIONS

The present application claims the benefit under 35 U.S.C. § 120 as a continuation application of U.S. application Ser. No. 15/567,202, filed on Oct. 17, 2017, now U.S. Pat. No. 11,153,515, which claims the benefit under 35 U.S.C. § 371 as a U.S. National Stage Entry of International Application No. PCT/JP2016/054925, filed in the Japanese Patent Office as a Receiving Office on Feb. 19, 2016, which claims priority to Japanese Patent Application Number JP2015-088992, filed in the Japanese Patent Office on Apr. 24, 2015, each of which applications is hereby incorporated by reference in its entirety.

TECHNICAL FIELD

The present disclosure relates to a solid state image sensor, a semiconductor device, and an electronic device.

BACKGROUND ART

In a solid state image sensor which is an example of a semiconductor device, the signal transmission speed of pixel control lines for controlling the operation of pixels dominates characteristics, when highly accurate synchronicity (in-plane synchronicity) of light exposure time is required in an imaging capturing surface (light receiving surface). Moreover, delay due to time constants decided by line resistances and parasitic capacitances of the pixel control lines is a main factor that decreases the signal transmission speed. The pixel control lines are arranged to traverse a pixel array unit in a row direction. Thus, the line lengths of the pixel control lines must be long, and thus the time constants of the pixel control lines are large.

For example, with regard to driving of the pixel control lines, the next configuration is employed in a stacked solid state image sensor in which a first semiconductor substrate including a pixel array unit and a second semiconductor substrate including a control circuit unit for driving pixels are stacked. That is, the stacked solid state image sensor employs a configuration that transmits a pixel control signal generated by the control circuit unit in the second semiconductor substrate to the first semiconductor substrate through a penetration via (for example, refer to Patent Literature 1).

CITATION LIST

Patent Literature

Patent Literature 1: JP 2011-159958A

DISCLOSURE OF INVENTION

Technical Problem

In the past technology described in Patent Literature 1, it is difficult to form a penetration via in the middle of the pixel array unit including the pixels arrayed regularly, from a view point of continuity of pixel arrangement. Hence, the penetration via must be located at an end portion of the pixel array unit. As a result, the pixel control lines arranged to traverse the pixel array unit in the row direction are driven from the end portion of the pixel array unit. Hence, there is a large delay of the pixel control signal due to the time constants decided by the line resistances and the parasitic capacitances of the pixel control lines, which hinders speeding up of pixel control.

Thus, the present disclosure has a purpose of providing a solid state image sensor, a semiconductor device, and an electronic device including the solid state image sensor, which is capable of speeding up of pixel control.

Solution to Problem

A solid state image sensor of the present disclosure for achieving the above purpose includes: a first semiconductor substrate provided with at least a pixel array unit in which pixels that perform photoelectric conversion are arranged in a matrix form; and a second semiconductor substrate provided with at least a control circuit unit that drives the pixels. The first semiconductor substrate and the second semiconductor substrate are stacked, with first surfaces on which wiring layers are formed facing each other, the pixel array unit is composed of a plurality of divided array units, the control circuit unit is provided corresponding to each of the plurality of divided array units, and electrical connection is established in each of the divided array units, through an electrode located on each of the first surfaces of the first semiconductor substrate and the second semiconductor substrate, between the pixel array unit and the control circuit unit. Also, an image capturing device of the present disclosure for achieving the above purpose is an electronic device including the solid state image sensor of the above configuration.

A semiconductor device of the present disclosure for achieving the above purpose includes: a first semiconductor substrate provided with a circuit unit in which unit circuits are arranged in a matrix form; and a second semiconductor substrate provided with a drive unit that drives the unit circuits. The first semiconductor substrate and the second semiconductor substrate are stacked, with first surfaces on which wiring layers are formed facing each other, the circuit unit is composed of a plurality of divided circuit units, the drive unit is provided corresponding to each of the plurality of divided circuit units, and electrical connection is established in each of the divided circuit units, through an electrode located on each of the first surfaces of the first semiconductor substrate and the second semiconductor substrate, between the circuit unit and the drive unit.

In the solid state image sensor, the semiconductor device, or the electronic device of the above configuration, the pixel array unit (circuit unit) is divided into a plurality of sections, to reduce the lengths of the control lines of the pixels (unit circuit) to a length obtained by dividing the undivided length by the number of divisions. Also, a penetration via is not used between the first semiconductor substrate and the second semiconductor substrate, but the pixel array unit (circuit unit) and the control circuit unit (drive unit) are connected electrically in each divided array unit (divided circuit unit) by using an electrode located on the first surfaces, and thereby the time constants decided by the line resistances and the parasitic capacitances of the control lines of each divided array unit, which is a drive target of the control circuit unit, become smaller than a case in which the array unit is not divided.

Advantageous Effects of Invention

According to the present disclosure, the time constants of the control lines of each divided circuit unit, which is the drive target of the drive unit, become smaller than a case in which the circuit unit is not divided, and thus speeding up of pixel control is achieved.

Note that the effect described here is not a limitation necessarily, but one of the effects described in the present specification may be achieved. Also, the effect described in the present specification is just an example and is not limited thereto, and an additional effect may be enabled.

MODE(S) FOR CARRYING OUT THE INVENTION

Figure 1:
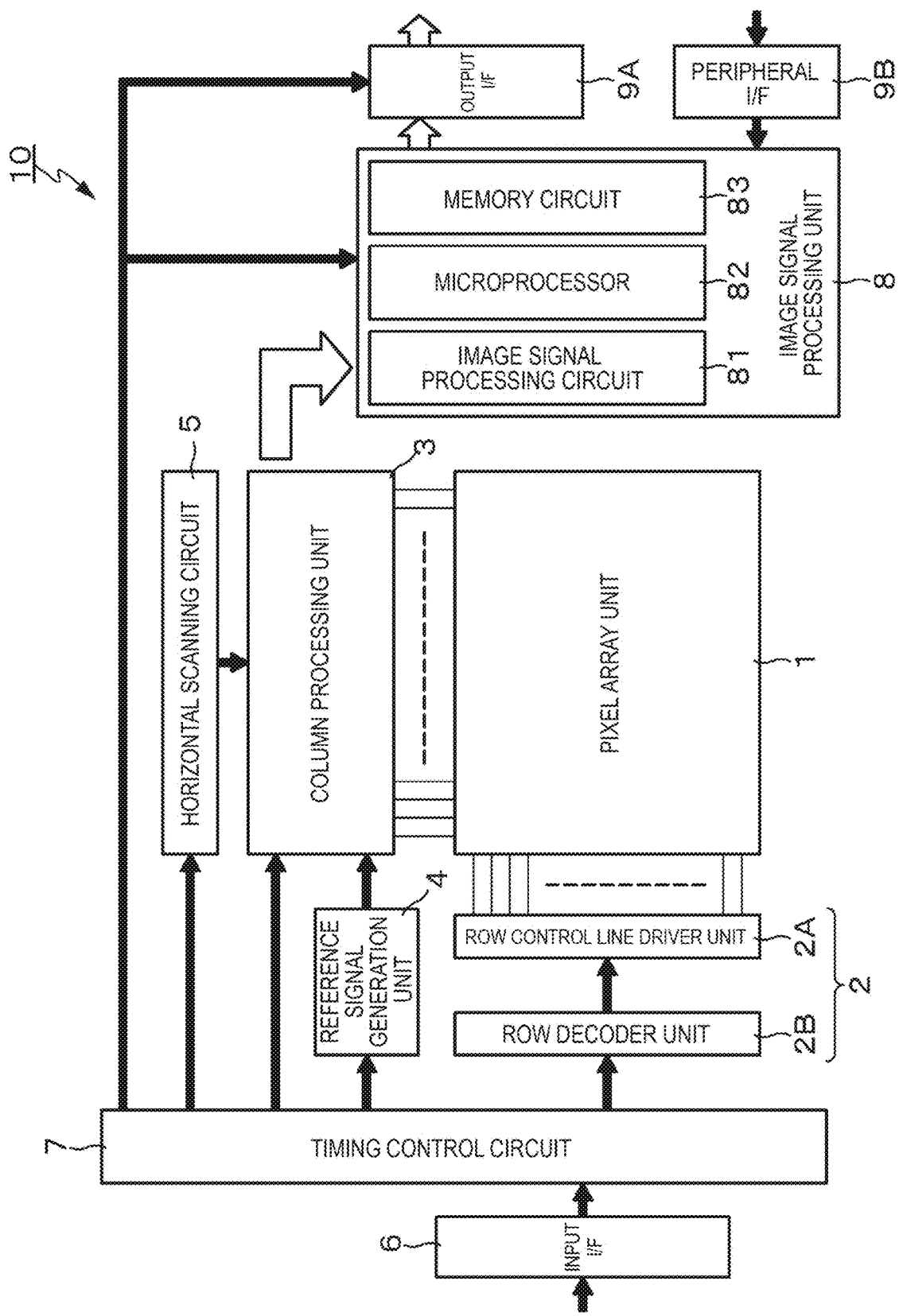
FIG. 1 is a schematic configuration diagram illustrating an example of a system configuration of a CMOS image sensor to which a technology of the present disclosure is applied.

In the following, a mode for carrying out the technology of the present disclosure (hereinafter, referred to as "embodiment") will be described in detail by using drawings. The technology of the present disclosure is not limited to the embodiment. In the below description, the same reference signs are used for the same elements or the elements having the same function, and repetitive description is omitted. Note that description will be made in the following order.

1. Overall Description Relevant to Solid State Image Sensor and Electronic Device of Present Disclosure
2. Solid State Image Sensor to Which Technology of Present Disclosure is Applied
   2-1. System Configuration (Example of CMOS Image Sensor)
   2-2. Specific Configuration of Pixel Array Unit and Column Processing Unit
   2-3. Configuration of Unit Pixel
   2-4. Denoising Process by Correlated Double Sampling
   2-5. Back Side Illumination Pixel Structure
   2-6. Stack Structure (Stacked CMOS Image Sensor)
   2-7. Problem When Via is Used
3. Embodiment of Present Disclosure
   3-1. First Working Example (Example in Which Pixel Array Unit is Divided into Four in Row Direction)
   3-2. Second Working Example (Example in Which Row Control Line Driver Unit and Row Decoder Unit are Separated)
   3-3. Third Working Example (Example in Which Capacitive Element is Added to Stabilize Internal Power Supply)
4. Variant Example
5. Electronic Device of Present Disclosure
   5-1. Image Capturing Device
   5-2. Distance Measuring Device <Overall Description Relevant to Solid State Image Sensor and Electronic Device of Present Disclosure>

In the solid state image sensor and the electronic device of the present disclosure, a first semiconductor substrate can be configured to accept incoming light from a second surface side opposite to a first surface into a plurality of pixels. Also, in a pixel array unit, pixel control lines are arranged along respective pixel rows, and the pixel control lines are divided, corresponding to a plurality of divided array units.

In the solid state image sensor and the electronic device of the present disclosure that includes the above preferable configuration, a control circuit unit can be configured such that the pixel array unit includes a control line driver unit for driving the pixel control lines arranged along the respective pixel rows. In this case, the control line driver unit is configured to deliver a timing control signal that is referred in circuit operation, to the circuit units corresponding to the respective pixel rows, in a clock tree structure. Also, a plurality of pixel control lines are grouped into blocks. In this case, the control line driver unit is configured to deliver the timing control signal to the pixel control lines with a constant delay between the blocks.

Further, in the solid state image sensor and the electronic device of the present disclosure that includes the above preferable configuration, the control circuit unit is configured to include a decoder unit that supplies a decode signal to the control line driver unit. In this case, the control line driver units are provided for each of the plurality of divided array units, and the decoder unit is commonly provided for the plurality of divided array units. Also, the control line driver unit is configured to include a capacitive element for stabilizing the power supply, which is connected between a high electric potential side power supply and a low electric potential side power supply of an output stage.

Also, the electronic device of the present disclosure that includes the above preferable configuration includes a light source that radiates light on an imaged object, and receives a reflected light from the imaged object based on a radiation light from the light source by the solid state image sensor, and measures the distance to the imaged object, on the basis of a detected signal of the solid state image sensor.

<Solid State Image Sensor to Which Technology of Present Disclosure is Applied>

First, a solid state image sensor to which the technology of the present disclosure is applied (i.e., a solid state image sensor of the present disclosure) will be described. The solid state image sensor is also an example of a semiconductor device of the present disclosure. Here, the solid state image sensor will be described, taking an example of a CMOS image sensor which is a kind of an X-Y address type solid state image sensor, for example.

[System Configuration]

FIG. 1 is a schematic configuration diagram illustrating an example of a system configuration of the CMOS image sensor to which the technology of the present disclosure is applied. As illustrated in FIG. 1, a CMOS image sensor 10 according to the present example includes a pixel array unit 1, a vertical drive circuit (a row scan circuit) 2, a column processing unit 3, a reference signal generation unit 4, and a horizontal scanning circuit (a column scanning circuit) 5. The CMOS image sensor 10 further includes an input interface (an interface) 6, a timing control circuit 7, an image signal processing unit 8, an output interface 9A, and a peripheral interface 9B.

In the CMOS image sensor 10 of the above system configuration, the pixel array unit 1 is configured such that unit pixels 20 (refer to FIG. 2) including photoelectric conversion elements are arranged two-dimensionally in a matrix form. The timing control circuit 7 generates a clock signal and a control signal that is referred in the operation of the vertical drive circuit 2, the column processing unit 3, the reference signal generation unit 4, and the horizontal scanning circuit 5, on the basis of a master clock input from the outside through the input interface 6.

The vertical drive circuit 2 is composed of a row control line driver unit 2A and a row decoder unit 2B, and performs control of row address and row scan to the pixel array unit 1 including the unit pixels (hereinafter, simply referred to as "pixel" in some cases) 20 arrayed two-dimensionally in a matrix form. By this control of the row address and the row scan, a pixel signal is read out from the selected pixel 20, and is supplied to the column processing unit 3. The column processing unit 3 performs a process for converting an analog pixel signal read out from each pixel 20 of the pixel array unit 1, to a digital pixel signal, by using a reference voltage $V_{ref}$ supplied from the reference signal generation unit 4. Detail of the column processing unit 3 will be described later. The reference signal generation unit 4 generates the reference voltage $V_{ref}$ used in the column processing unit 3, when AD conversion (analog-to-digital conversion) is performed.

The horizontal scanning circuit 5 performs control of column address and column scan, to the pixel signal converted from analog to digital by the column processing unit 3. By this control of the column address and the column scan, the digital pixel signal converted from analog to digital by the column processing unit 3 is supplied to the image signal processing unit 8 as captured image data. The image signal processing unit 8 includes an image signal processing circuit 81, a microprocessor 82, and a memory circuit 83 for example, and performs various types of signal processing to the captured image data supplied under the control by the horizontal scanning circuit 5. The captured image data to which various types of signal processing are performed by the image signal processing unit 8 is output to the outside through the output interface 9A.

[Specific Configuration of Pixel Array Unit and Column Processing Unit]

Figure 2:
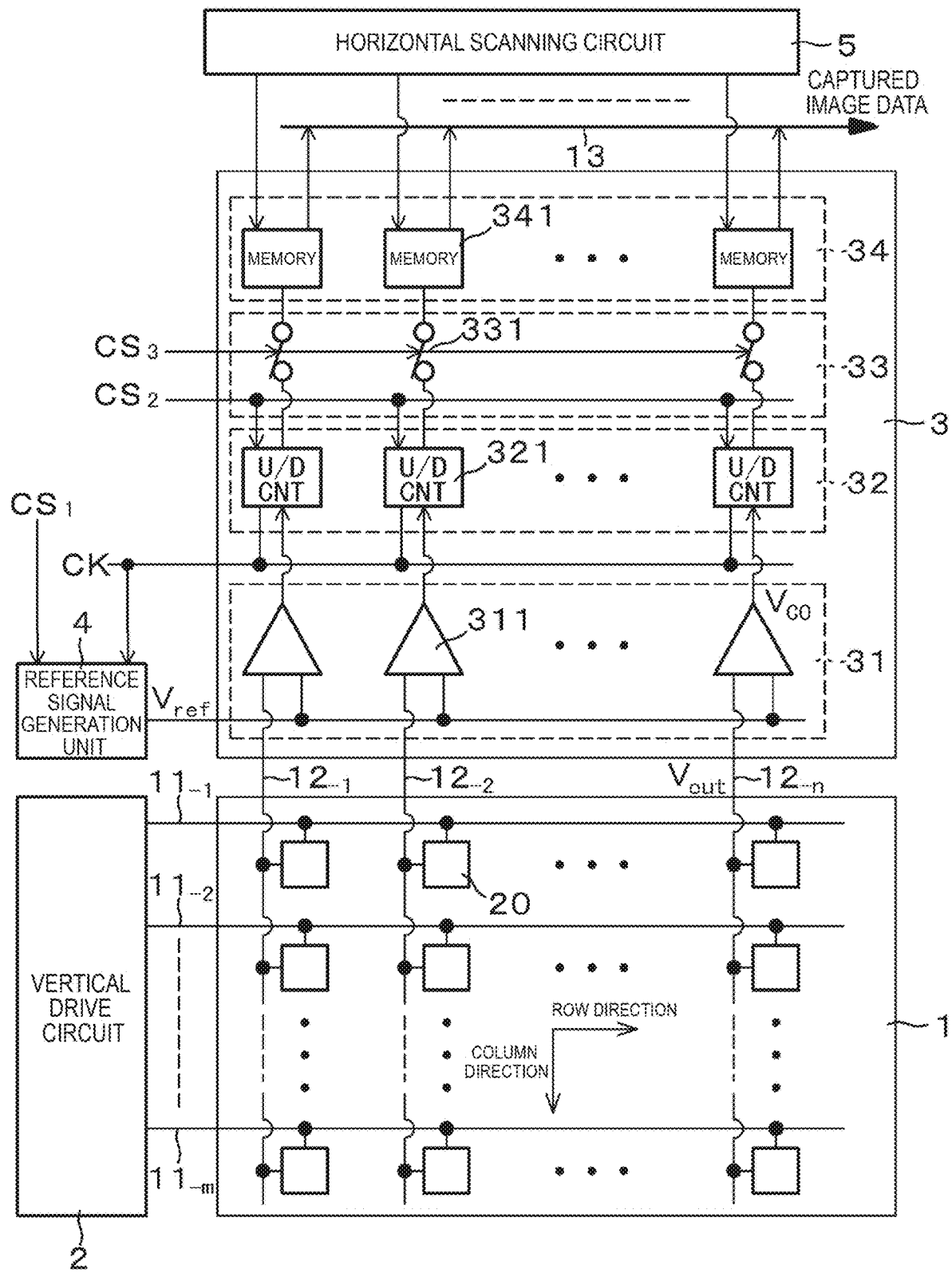
FIG. 2 is a block diagram illustrating a specific configuration of a pixel array unit and a column processing unit.

Next, a specific configuration of the pixel array unit 1 and the column processing unit 3 will be described by using FIG. 2. FIG. 2 is a block diagram illustrating the specific configuration of the pixel array unit 1 and the column processing unit 3.

(Pixel Array Unit)

As illustrated in FIG. 2, the pixel array unit 1 is configured such that the unit pixels 20 are arranged two-dimensionally in the row direction and the column direction, that is, in a matrix form. The unit pixel 20 includes a photoelectric conversion element (photoelectric conversion unit) that generates and accumulates a photo charge commensurate with the received light amount. Here, the row direction is an array direction (i.e., horizontal direction) of pixels along pixel rows, and the column direction is an array direction (i.e., vertical direction) of pixels along pixel columns. Here, a pixel array of m pixel rows and n pixel columns is formed.

For the pixel array of m rows and n columns, the row control lines 11 ($11_{-1}$ to $11_{-m}$) as the pixel control lines are arranged along the row direction for the respective pixel rows, and the column signal lines 12 ($12_{-1}$ to $12_{-n}$) are arranged for the respective pixel columns along the column direction. The row control lines 11 transmit the control signal output to the respective pixel rows from the vertical drive circuit 2 when the pixel signal is read out from the unit pixels 20. FIG. 1 illustrates the row control lines 11 as a single line, but the row control lines 11 are not limited to a single line. One ends of each row control lines $11_{-1}$ to $11_{-m}$ are connected to respective output terminals corresponding to the respective pixel rows of the vertical drive circuit 2.

(Vertical Drive Circuit)

A specific configuration of the vertical drive circuit 2 is not illustrated in the drawing, but generally includes two scanning systems of a readout scanning system and a sweep scanning system. The readout scanning system selectively and sequentially scans the unit pixels 20 of the pixel array unit 1 row by row, in order to read out the signals from the unit pixels 20. The pixel signals read out from the unit pixels 20 are analog signals. The sweep scanning system performs sweep scanning a time of shutter speed before the readout scanning, to readout rows to which the readout scanning is performed by the readout scanning system.

Unnecessary electric charge is swept out from the photoelectric conversion elements of the unit pixels 20 of the readout rows, by this sweep scanning by the sweep scanning system, so that the photoelectric conversion elements are reset. Then, what is called electronic shutter operation is performed by sweeping out (resetting) the unnecessary electric charge by the sweep scanning by the sweep scanning system. Here, electronic shutter operation means operation that discards the photo charge of the photoelectric conversion elements and starts new light exposure (starts accumulation of photo charge).

The signal read out by the read operation by the readout scanning system corresponds to a light amount received after immediately previous read operation or after the electronic shutter operation. Then, the period from a readout timing by the immediately previous read operation or a sweep out timing by the electronic shutter operation to a readout timing by the read operation of this time is the light exposure period of photo charge in the unit pixels 20.

(Column Processing Unit)

The column processing unit 3 is configured as an AD converter that converts, to a digital pixel signal, the analog pixel signal output from each unit pixel 20 of the pixel array unit 1 through each pixel column, with respect to each pixel column of the pixel array unit 1, that is, for each column signal line 12 ($12_{-1}$ to $12_{-n}$), for example. The reference voltage $V_{ref}$ generated by the reference signal generation unit 4 is used at the time of this AD conversion.

The reference signal generation unit 4 generates the reference voltage $V_{ref}$ of what is called lamp waveform, whose voltage value changes in a step manner as the time elapses. The reference signal generation unit 4 can be configured by using a digital-to-analog conversion (DA conversion) circuit, for example. Note that the reference signal generation unit 4 is not limited to the configuration that uses the DA conversion circuit. The reference signal generation unit 4 generates the reference voltage $V_{ref}$ of the lamp wave on the basis of clock CK supplied from the timing control circuit 7, under the control by a control signal CSI supplied from the timing control circuit 7 of FIG. 1. Then, the reference signal generation unit 4 supplies the generated reference voltage $V_{ref}$ to the column processing unit 3.

As illustrated in FIG. 2, the column processing unit 3 of the AD converter configuration includes a comparator circuit 31, a counter circuit 32, a switch circuit 33, and a memory circuit 34, and has the same configuration in each pixel column.

The comparator circuit 31 is composed of comparators 311 provided for the respective pixel columns. The comparators 311 compares a signal voltage $V_{out}$ of the column signal line 12 commensurate with the pixel signal output from each unit pixel 20 of the pixel array unit 1, with the reference voltage $V_{ref}$ of the lamp wave supplied from the reference signal generation unit 4. Then, the comparators 311 sets an output $V_{co}$ at a high level when the reference voltage $V_{ref}$ is higher than the signal voltage $V_{out}$, and sets the output $V_{co}$ at a low level when the reference voltage $V_{ref}$ is equal to or lower than the signal voltage $V_{out}$, for example.

The counter circuit 32 is composed of up/down (U/D) counters 321 provided for the respective pixel columns. The up/down counters 321 are asynchronous counters, and the clock CK is supplied at the same timing as the reference signal generation unit 4 from the timing control circuit 7, under the control by a control signal $CS_2$ supplied from the timing control circuit 7 of FIG. 1. Then, the up/down counter 321 measures a comparison period from a start of comparison operation to an end of the comparison operation in the comparators 311, by performing down count or up count in synchronization with the clock CK.

The switch circuit 33 is composed of transfer switches 331 provided for the respective pixel columns. The transfer switch 331 becomes an ON (closed) state when the count operation of the up/down counter 321 is completed with regard to the unit pixel 20 of a certain pixel row, under the control by a control signal $CS_3$ supplied from the timing control circuit 7 of FIG. 1. Then, the transfer switch 331 transfers the count result of the up/down counter 321 to the memory circuit 34.

The memory circuit 34 is composed of memories 341 provided for the respective pixel columns, and stores the count results of the up/down counters 321 transferred by the transfer switches 331 for the respective pixel columns, as N-bit digital signals corresponding to the analog pixel signals read out from the unit pixels 20.

The column processing unit 3 of the above configuration is configured to selectively perform the AD conversion operation corresponding to each of operation modes including a high speed frame rate mode and a standard frame rate mode in a progressive scan method that reads out the information of all the unit pixels 20 at a time. Here, the high speed frame rate mode is the operation mode that increases the frame rate by N times (for example, two times) by setting the light exposure time of the unit pixel 20 to 1/N thereof, as compared with the standard frame rate mode.

As described above, the comparators 311 in the column processing unit 3 first perform comparison operation between the analog signal voltages $V_{out}$ supplied in the respective pixel columns through column signal lines $12_{-1}$ to $12_{-n}$ from the respective unit pixels 20 of the pixel array unit 1 and the reference voltage $V_{ref}$. Then, the up/down counters 321 perform the count operation from the start of the comparison operation to the end of the comparison operation in the comparators 311, and thereby the analog signals are converted to digital signals and are stored in the respective memories 341 of the memory circuit 34. Then, the N bit digital signals stored in the respective memories 341 of the memory circuit 34 are read out to an output line 13 in order, under the control by the horizontal scanning circuit 5, and are supplied to the image signal processing unit 8 of FIG. 1 as the captured image data via the output line 13.

[Configuration of Unit Pixel]

Next, the configuration of the unit pixel 20 (the configuration of the pixel circuit) will be described by using FIG. 3. FIG. 3 is a circuit diagram illustrating an example of the configuration of the unit pixel 20.

As illustrated in FIG. 3, the unit pixel 20 according to the present example includes a photo diode 21 for example, as the photoelectric conversion element. The unit pixel 20 includes an electric charge voltage conversion section 22, a transfer transistor (a transfer gate unit) 23, a reset transistor 24, an amplification transistor 25, a selection transistor 26, and an electric charge discharge transistor 27, for example, in addition to the photo diode 21.

Note that, here, N-channel MOS transistors are used as the transfer transistor 23, the reset transistor 24, the amplification transistor 25, the selection transistor 26, and the electric charge discharge transistor 27, for example. Note that the combination of the conductivity types of the transfer transistor 23, the reset transistor 24, the amplification transistor 25, the selection transistor 26, and the electric charge discharge transistor 27 illustrated here is just an example, and is not limited to this combination.

In this unit pixel 20, a plurality of control lines are commonly arranged for the pixels of the same pixel rows, as the aforementioned row control lines 11 ($11_{-1}$ to $11_{-m}$ FIG. 3 omits the illustration of the plurality of control lines, for simplicity of FIG. 3. The plurality of control lines are connected to the output terminals corresponding to the respective pixel rows of the vertical drive circuit 2 of FIG. 2 in the respective pixel rows. The vertical drive circuit 2 outputs a transfer signal TRG, a reset signal RST, a selection signal SEL, and an electric charge discharge signal OFG to the plurality of control lines, as pixel control signals as appropriate.

The photo diode 21 has an anode electrode connected to a low electric potential side power supply (for example, ground), and photoelectrically converts the received light to photo charge (here, photoelectron) of an electric charge amount commensurate with the light amount, to accumulate the photo charge. The cathode electrode of the photo diode 21 is electrically connected to the gate electrode of the amplification transistor 25 via the transfer transistor 23.

The region electrically connected to the gate electrode of the amplification transistor 25 is the electric charge voltage conversion section 22 that converts electric charge to voltage. In the following, the electric charge voltage conversion section 22 is referred to as an FD (floating diffusion/floating diffusion region/impurity diffusion region) section 22.

The transfer transistor 23 is connected between the cathode electrode of the photo diode 21 and the FD section 22. The transfer signal TRG whose high level (for example, $V_{DD}$ level) is active (hereinafter, referred to as "high active") is supplied from the vertical drive circuit 2 to the gate electrode of the transfer transistor 23. The transfer transistor 23 becomes conductive in response to the transfer signal TRG, and thereby transfers the photo charge that is photoelectrically converted in the photo diode 21 and accumulated, to the FD section 22.

The reset transistor 24 has a drain electrode connected to a power supply $V_{DD}$, and a source electrode connected to the FD section 22. The reset signal RST of high active is supplied from the vertical drive circuit 2 to the gate electrode of the reset transistor 24. The reset transistor 24 becomes conductive in response to the reset signal RST, and resets the FD section 22 by discarding the electric charge of the FD section 22 to the power supply $V_{DD}$.

The amplification transistor 25 has a gate electrode connected to the FD section 22, and a drain electrode connected to the power supply $V_{DD}$. This amplification transistor 25 is an input section of a source follower which is a readout circuit that reads out the signal obtained by the photoelectric conversion in the photo diode 21. That is, the amplification transistor 25 has a source electrode connected to the column signal line 12 ($12_{-1}$ to $12_{-n}$) via the selection transistor 26, and thereby configures a source follower with an electric current source (not illustrated in the drawings) connected to one end of the column signal line 12.

The selection transistor 26 has a drain electrode connected to the source electrode of the amplification transistor 25, and a source electrode connected to the column signal line 12, for example. The selection signal SEL of high active is supplied from the vertical drive circuit 2 to the gate electrode of the selection transistor 26. The selection transistor 26 becomes conductive in response to the selection signal SEL, and thereby sets the unit pixel 20 in a selected state and transmits the signal output from the amplification transistor 25 to the column signal line 12. Note that the selection transistor 26 can also employ a circuit configuration connected between the power supply $V_{DD}$ and the drain electrode of the amplification transistor 25.

The electric charge discharge transistor 27 is connected between the power supply $V_{DD}$ and the cathode electrode of the photo diode 21. The electric charge discharge signal OFG of high active is supplied from the vertical drive circuit 2 to the gate electrode of the electric charge discharge transistor 27. The electric charge discharge transistor 27 becomes conductive in response to the electric charge discharge signal OFG, and resets the photo diode 21 by discarding the electric charge of the photo diode 21 to the power supply $V_{DD}$.

Note that the configuration of the unit pixel (pixel circuit) 20 illustrated here is just an example, and is not limited to the pixel configuration composed of the five transistors including the transfer transistor 23, the reset transistor 24, the amplification transistor 25, the selection transistor 26, and the electric charge discharge transistor 27. For example, a pixel configuration composed of four transistors including the amplification transistor 25 having the function of the selection transistor 26, or a pixel configuration composed of four or three transistors not including the electric charge discharge transistor 27 may be employed.

[Denoising Process by Correlated Double Sampling]

In general, in the CMOS image sensor 10 composed of the unit pixels 20 arranged as in the above configuration, a denoising process by correlated double sampling (CDS) is performed in order to remove the noise at the time of reset operation. The operation of the denoising process by this correlated double sampling will be described by using the timing waveform diagram of FIG. 3B.

Figure 3A:
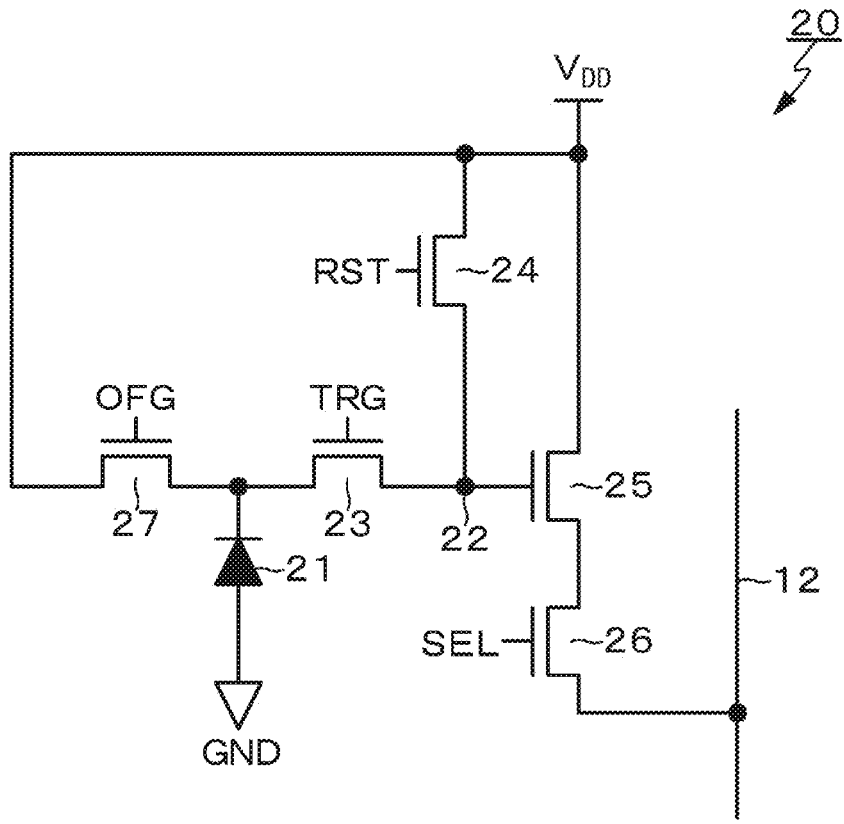
FIG. 3A is a circuit diagram illustrating an example of a configuration of a unit pixel.
Figure 3B:
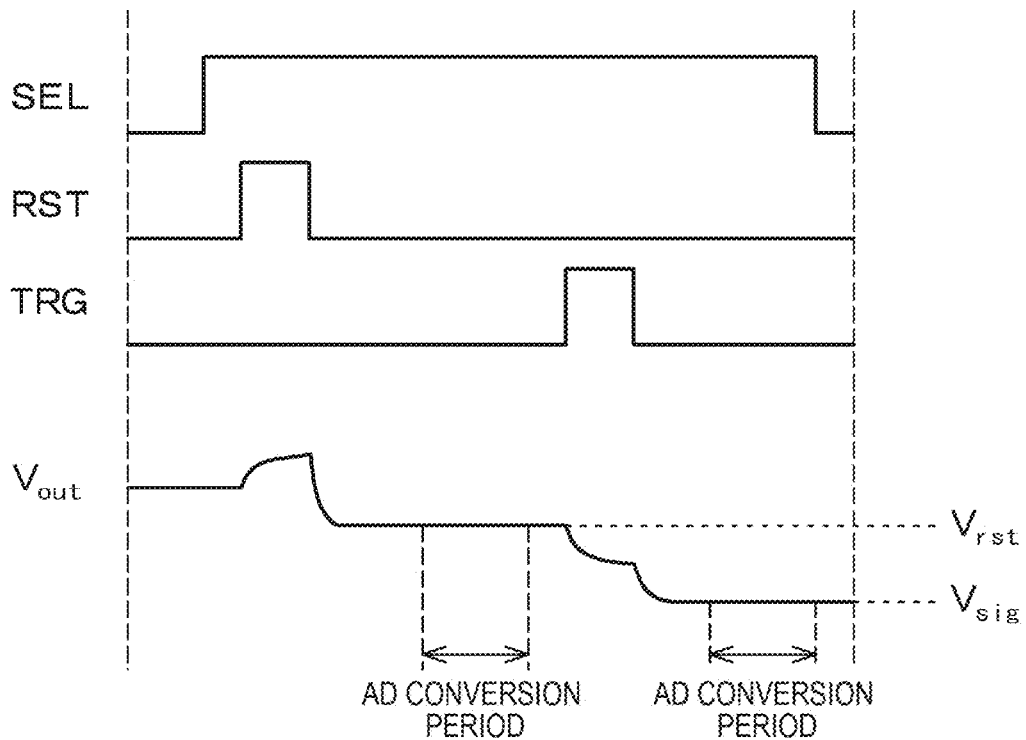
FIG. 3B is a timing waveform diagram used in describing operation of a denoising process by correlated double sampling.

As illustrated in the timing waveform diagram of FIG. 3B, the unit pixel 20 selected by the selection signal SEL for reading out the signal resets the FD section 22 to the power supply electric potential $V_{DD}$ in response to the reset signal RST, and reads out the power supply electric potential $V_{DD}$ as the reset level $V_{rst}$. Subsequently, the transfer transistor 23 is driven by the transfer signal TRG, and the electric charge accumulated in the photo diode 21 is transferred to the FD section 22, and the electric charge is read out as the signal level $V_{sig}$.

In the reset level $V_{rst}$ and the signal level $V_{sig}$, noise (random noise) that occurs at random in each resetting, such as heat noise and noise due to coupling of parasitic capacitance, is added, when the FD section 22 is reset to the power supply electric potential $V_{DD}$. As these noises, different noises are added each time the FD section 22 is reset.

In a readout method that reads out the reset level $V_{rst}$ in advance, the random noise that occurs at the time of resetting is retained by the FD section 22, and thus the signal level $V_{sig}$ read out by adding the signal electric charge retains the same noise amount as the reset level $V_{rst}$. Hence, the signal from which these noises are removed can be obtained by performing the correlated double sampling operation that subtracts the reset level $V_{rst}$ from the signal level $V_{sig}$. Also, fixedly added noise (fixed pattern noise), such as dispersion of the threshold value of the amplification transistor 25 used in reading out the signal, can be removed.

In the CMOS image sensor 10 according to the present example, the column processing unit 3 executes the correlated double sampling process at the time of the AD conversion process. Specifically, the column processing unit 3 uses the up/down counters 321 as a measurement means for measuring a comparison period from the start of the comparison operation to the end of the comparison operation in the comparators 311. Then, at the time of measurement operation, the up/down counters 321 perform down count to the reset level $V_{rst}$, and perform up count to the signal level $V_{sig}$, with respect to the reset level $V_{rst}$ and the signal level $V_{sig}$ read out in order from the unit pixels 20. The difference between the signal level $V_{sig}$ and the reset level $V_{rst}$ can be obtained by the operation of this down count/up count. As a result, the correlated double sampling process is performed in addition to the AD conversion process, in the column processing unit 3. Note that, with regard to the correlated double sampling (CDS) process described here, predetermined operation is enabled at the time of rolling shutter, but is disabled at the time of global shutter that uses the pixel circuit of FIG. 3A (accumulation of the electric charge in the FD section 22).

[Back Side Illumination Pixel Structure]

Figure 4:
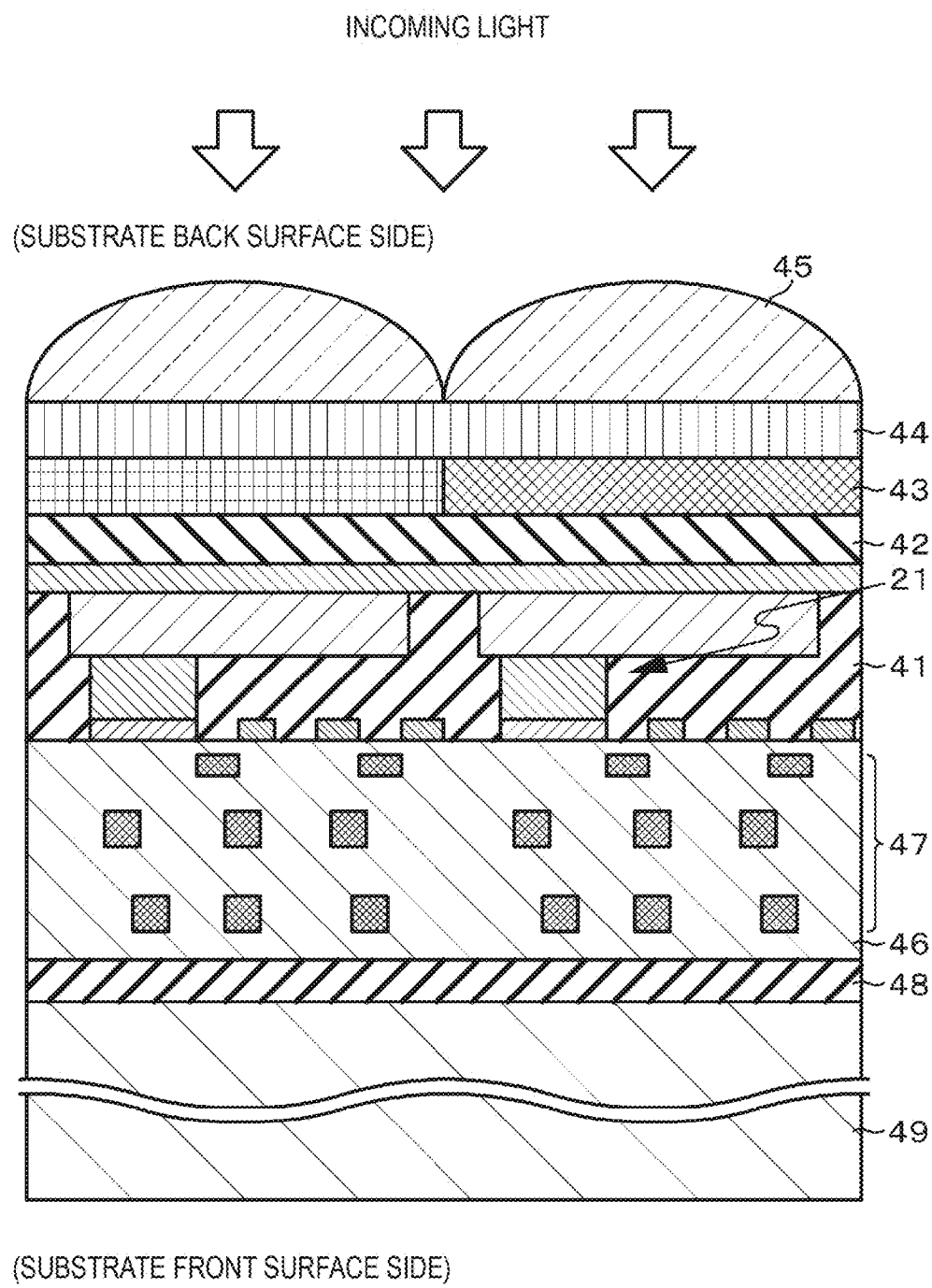
FIG. 4 is a cross-sectional view illustrating an example of a back side illumination pixel structure.

The unit pixels 20 in the CMOS image sensor 10 according to the above present example employ the back side illumination pixel structure. Here, when a first surface on which the wiring layer of the semiconductor substrate is formed is a substrate front surface, the "back side illumination pixel structure" is a pixel structure that accepts the incoming light (the radiated light) from a second surface opposite to the first surface, that is, a substrate back surface side (the back side of the semiconductor substrate). The overview of this back side illumination pixel structure will be described by using FIG. 4. FIG. 4 is a cross-sectional view illustrating an example of the back side illumination pixel structure. Here, a cross-sectional structure of two pixels are illustrated.

In FIG. 4, the photo diodes 21 and the pixel transistors (the transistors 23 to 27 of FIG. 3A), which are photoelectric conversion elements, are formed in the semiconductor substrate 41. Then, a color filter 43 is formed with an insulating film 42 in between, in the substrate back surface (second surface) side of the semiconductor substrate 41. Then, a flattening film 44 is stacked on the color filter 43, and a micro lens (on-chip lens) 45 is stacked on the flattening film 44 in order.

On the other hand, a wiring layer 47 composed of the gate electrodes of the pixel transistors (the transistors 23 to 27 of FIG. 3A) and the metal lines arranged in multi layers is formed in an interlayer insulating film 46 of the substrate front surface (the first surface) side of the semiconductor substrate 41. Then, a support substrate 49 is adhered by bonding adhesive 48, on the surface opposite to the semiconductor substrate 41, of the interlayer insulating film 46.

According to the above back side illumination pixel structure, the incoming light is accepted from the substrate back surface (the second surface) side on which the wiring layer 47 is not formed, and thereby the substrate back surface (the second surface) receives a larger amount of light than the front side illumination pixel structure having the same photo diode 21 area, and video having a significantly smaller noise amount can be achieved. Also, it is needless to layout each line of the wiring layer 37 in consideration of the light receiving surface of the photo diode 21. Thus, the freedom degree of layout of the lines becomes higher, and thus miniaturization of the pixels can be achieved as compared with the front side illumination pixel structure.

[Stack Structure]

Figure 5:
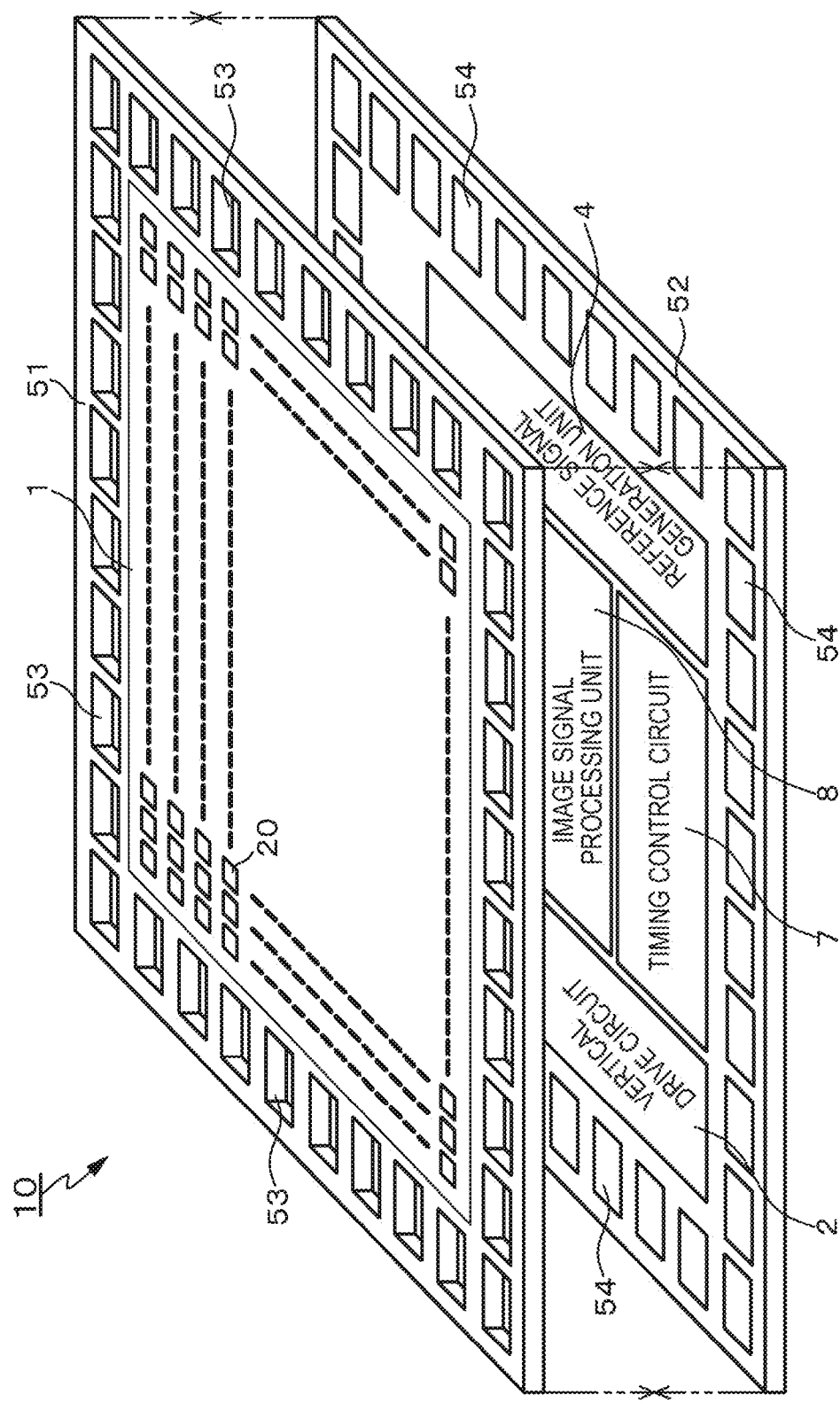
FIG. 5 is a schematic perspective view before stacking, illustrating an example of a configuration of a stack structure of a CMOS image sensor.

The CMOS image sensor 10 according to the above present example is a stacked CMOS image sensor that has a stack structure that stacks the pixel part (the pixel array unit 1) and the circuit sections (the vertical drive circuit 2, the column processing unit 3, etc.). The overview of the stack structure of the CMOS image sensor 10 according to the present example will be described by using FIG. 5. FIG. 5 is a schematic perspective view before stacking, which illustrates an example of the configuration of the stack structure of the CMOS image sensor 10.

The CMOS image sensor 10 according to the present example includes a first semiconductor substrate (hereinafter, referred to as "first chip") 51 and a second semiconductor substrate (hereinafter, referred to as "second chip") 52, and has a stack structure in which the first chip 51 is stacked as an upper side chip and the second chip 52 is stacked as a lower side chip.

In this stack structure, the first chip 51 of the upper side is a pixel chip provided with the pixel array unit 1 in which the unit pixels 20 including the photoelectric conversion elements (photo diodes 21) are two-dimensionally arranged in a matrix form. Openings 53 for ponding pads are formed in the periphery portions of the first chip 51.

The second chip 52 of the lower side is a circuit chip for forming the circuit sections that drives each pixel 20 of the pixel array unit 1 of the first chip 51 side, such as the vertical drive circuit 2, the column processing unit 3, the reference signal generation unit 4, the horizontal scanning circuit 5, the timing control circuit 7, and the image signal processing unit 8 in FIG. 1. In the periphery portion of the second chip 52, pad sections 54 for electrically connecting to the outside are provided, corresponding to the openings 53 for the ponding pads of the first chip 51.

Each pixel 20 of the pixel array unit 1 of the first chip 51 side has the aforementioned back side illumination pixel structure. Thus, the first chip 51 is stacked on the second chip 52, such that the substrate back surface (the second surface) is at the upper surface. In other words, the first chip 51 is stacked with the first surface (the substrate front surface), on which the wiring layer 47 (refer to FIG. 4) is formed, facing the second chip 52.

As described above, the pixel part (the pixel array unit 1) and the circuit sections (the vertical drive circuit 2, the column processing unit 3, etc.) are stacked, and thereby the first chip 51 needs to have the size (area) for forming the pixel array unit 1 only, and the size (area) of the first chip 51 and consequently the size of the entire CMOS image sensor 10 can be reduced. Also, the process suitable for the fabrication of the unit pixels 20 can be applied to the first chip 51, and the process suitable for the fabrication of the circuits can be applied to the second chip 52, and thereby the process is optimized in the production of the CMOS image sensor 10.

Figure 6A:
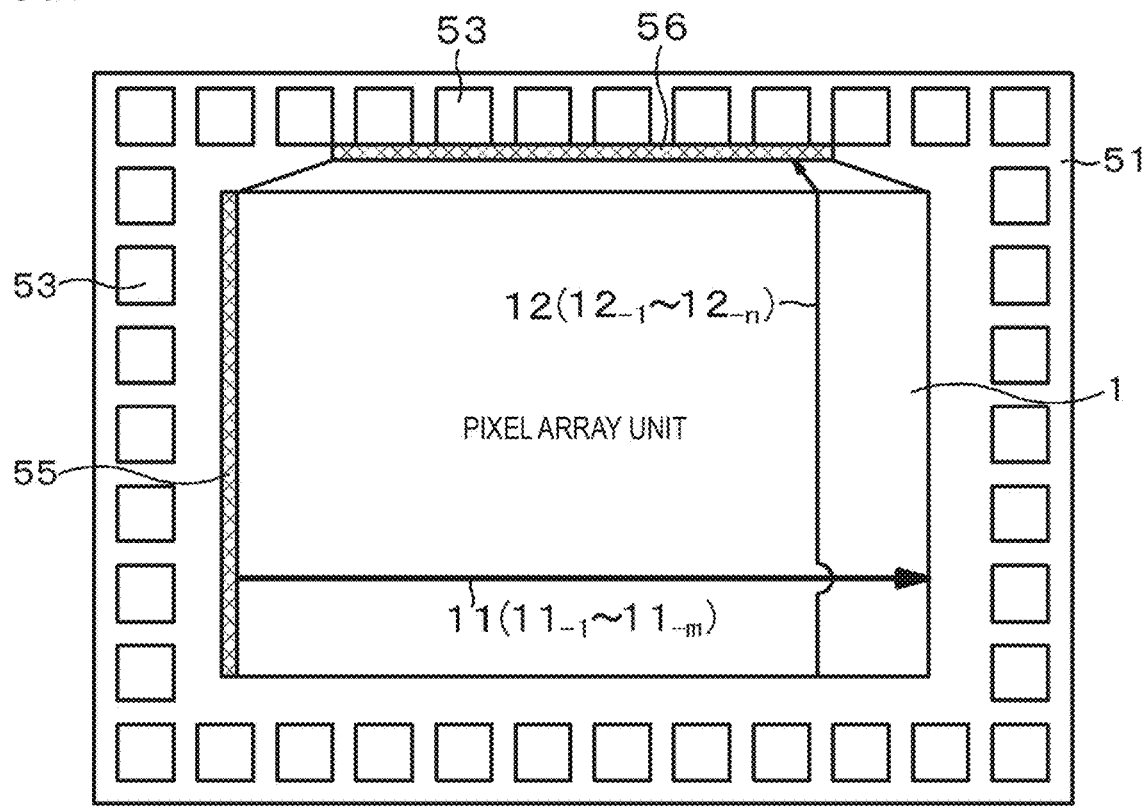
FIG. 6A is a schematic plan view illustrating an example of a floor plan of a first chip when a via is used.
Figure 6B:
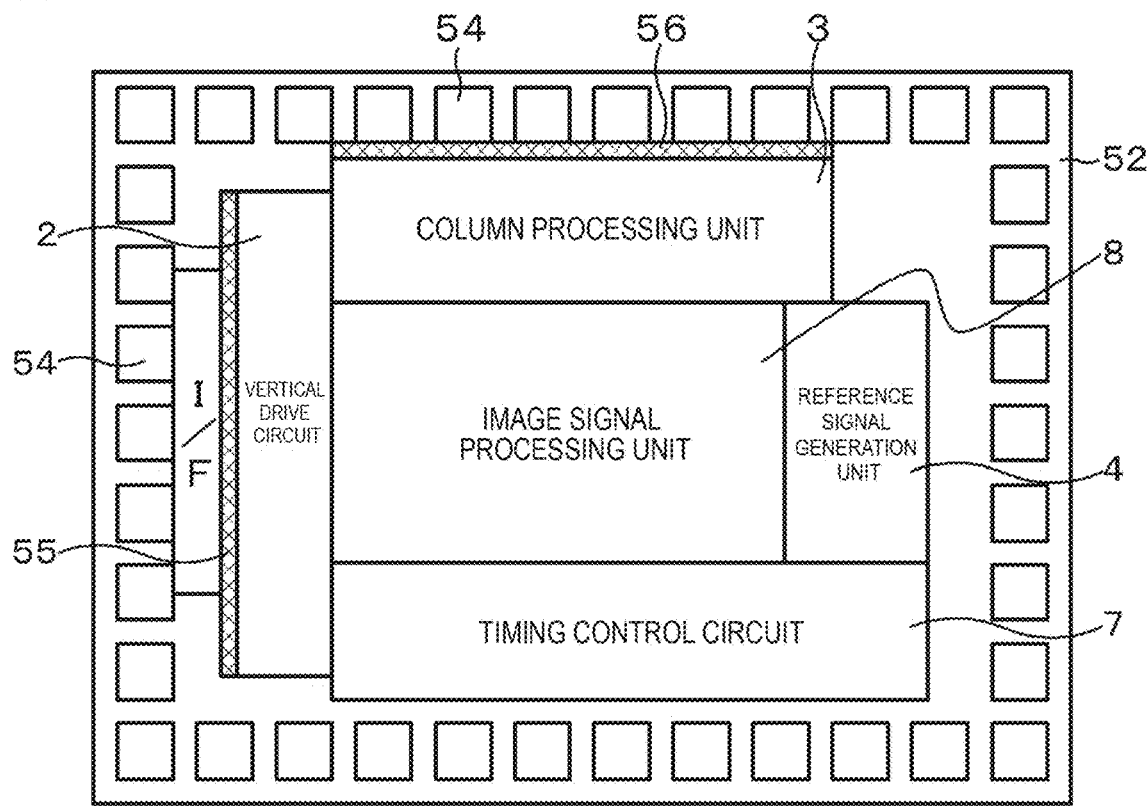
FIG. 6B is a schematic plan view illustrating an example of a floor plan of a second chip when a via is used.

FIG. 6A illustrates an example of a floor plan of the first chip 51, and FIG. 6B illustrates an example of a floor plan of the second chip 52. The past technology employs a configuration that uses a via in the electrical connection between the first chip 51 and the second chip 52.

It is necessary to transmit the control signal for controlling the row address and the row scan of the pixel array unit 1 from the second chip 52 to the first chip 51. Also, it is necessary to transmit the pixel signal read out from each pixel 20 of the pixel array unit 1 from the first chip 51 to the second chip 52. Thus, the output terminals corresponding to the respective pixel rows of the vertical drive circuit 2 on the second chip 52 and the row control lines 11 ($11_{-1}$ to $11_{-m}$) of the pixel array unit 1 on the first chip 51 are electrically connected through a penetration via 55 that penetrates the second chip 52 and the first chip 51. Also, the column signal lines 12 ($12_{-1}$ to $12_{-n}$) of the pixel array unit 1 on the first chip 51 and the input terminals corresponding to the respective pixel columns of the column processing unit 3 on the second chip 52 are electrically connected through a penetration via 56 that penetrates the first chip 51 and the second chip 52.

[Problem when Via is Used]

By the way, a method that reduces the line lengths of the row control lines 11 is effective, in order to achieve speeding up of the pixel control through the row control lines 11. By reducing the line lengths of the row control lines 11, the time constant decided by the line resistance and the parasitic capacitance of the row control lines 11 is reduced, and thus speeding up of the pixel control is achieved. However, when this method is employed, the vertical drive circuit 2 for driving the row control lines 11 is needed for each of the divided row control lines, and thus it has been difficult to employ this method in a non-stacked CMOS image sensor, in consideration of continuity of the pixel arrangement.

Also, it is difficult even for the stacked CMOS image sensor to form the penetration vias 55, 56 in the middle of the pixel array unit 1 in which the unit pixels 20 are arranged regularly, from the view point of the continuity of the pixel arrangement. Thus, for example, the penetration via 55 for the row control lines 11 must be located at an end portion (for example, an end portion at the left side) of the pixel array unit 1, as illustrated in FIG. 6A. In this case, the row control lines 11 arranged to traverse the pixel array unit 1 in the row direction are driven through the penetration via 55 located at one of the end portions of the pixel array unit 1. Hence, the delay of the pixel control signal due to the time constant decided by the line resistance and the parasitic capacitance of the row control lines 11 is large, hindering speeding up of the pixel control.

Embodiment of Present Disclosure

Thus, in an embodiment of the present disclosure, the stacked CMOS image sensor 10 in which the first chip 51 provided with the pixel part and the second chip 52 provided with the circuit sections are stacked with their substrate front surfaces (first surfaces) facing each other has the below configuration. That is, in the CMOS image sensor 10 according to the present embodiment, first, the region of the pixel array unit 1 provided in the first chip 51 is divided into a plurality of sections in the row direction, so that the pixel array unit 1 is composed of a plurality of divided array units. Thereby, the pixel row control lines 11 are divided, corresponding to the plurality of divided array units. Accordingly, the control circuit units, particularly the vertical drive circuit 2, the column processing unit 3, etc. which are provided in the second chip 52 are divided into a plurality of sections. Thereby, the vertical drive circuit 2 is provided, corresponding to each of the plurality of divided array units of the pixel array unit 1.

Then, in the CMOS image sensor 10 according to the present embodiment, electrodes (for example, bumps) are located on the substrate front surfaces of the first chip 51 and the second chip 52, and electrical connection is established in each divided array unit, through the electrodes between the substrate front surfaces, between the pixel array unit 1 and the vertical drive circuit 2. Here, when the number of divisions of the region of the pixel array unit 1, that is, the number of divided array units is X, the line lengths of the row control lines 11 ($11_{-1}$ to $11_{-m}$) in each of the plurality of divided array units become 1/X of the line length when the region of the pixel array unit 1 is not divided.

Also, the penetration vias 55, 56 (refer to FIG. 6) are not used in the electrical connection between the first chip 51 and the second chip 52, but the pixel array unit 1 and the vertical drive circuit 2 are electrically connected in each divided array unit, by using the electrodes located on the substrate front surfaces. Thereby, the time constant decided by the line resistance and the parasitic capacitance of the row the control lines 11 of each divided array unit, which is the drive target of the vertical drive circuit 2, becomes smaller than when the array unit is not divided, and thus improvement of the speeding up and the synchronicity of the pixel control of light exposure time or the like is achieved.

In the following, a specific working example of the CMOS image sensor 10 according to the present embodiment will be described.

First Working Example

Figure 7A:
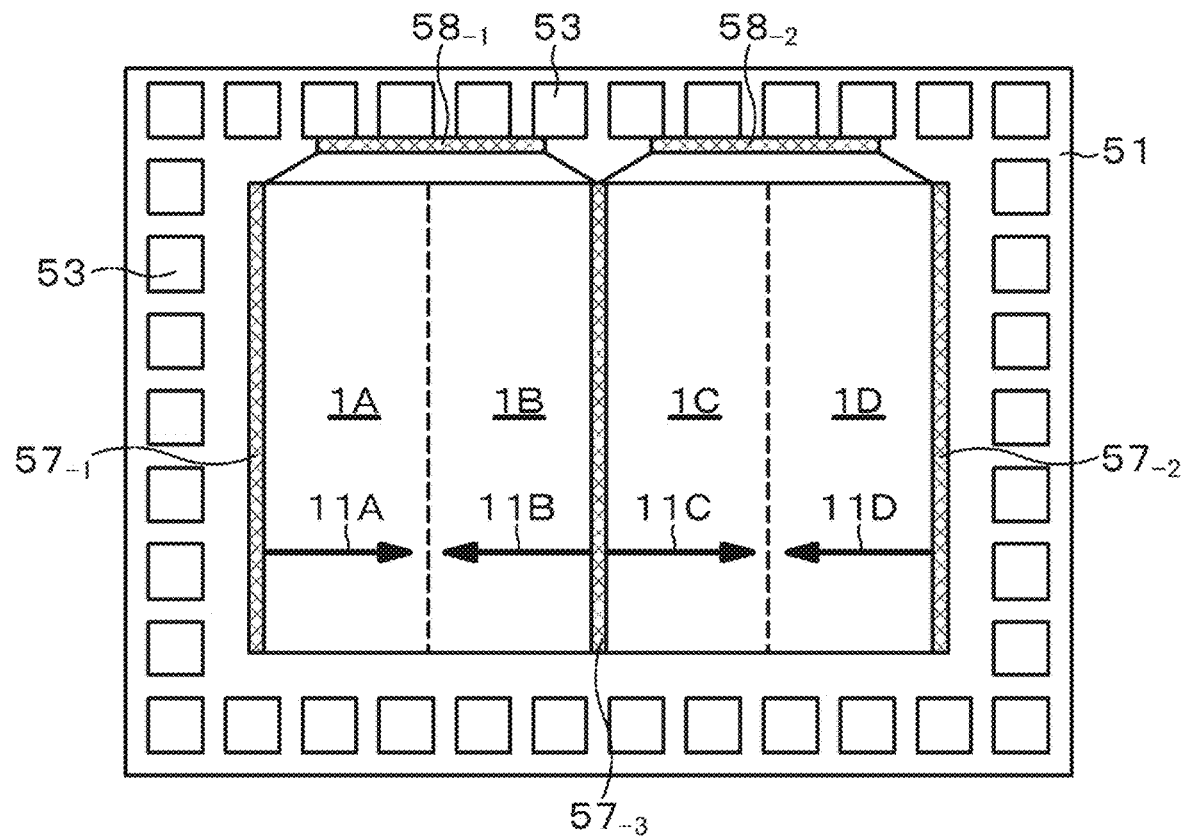
FIG. 7A is a schematic plan view illustrating a floor plan of a first chip according to a first working example.
Figure 7B:
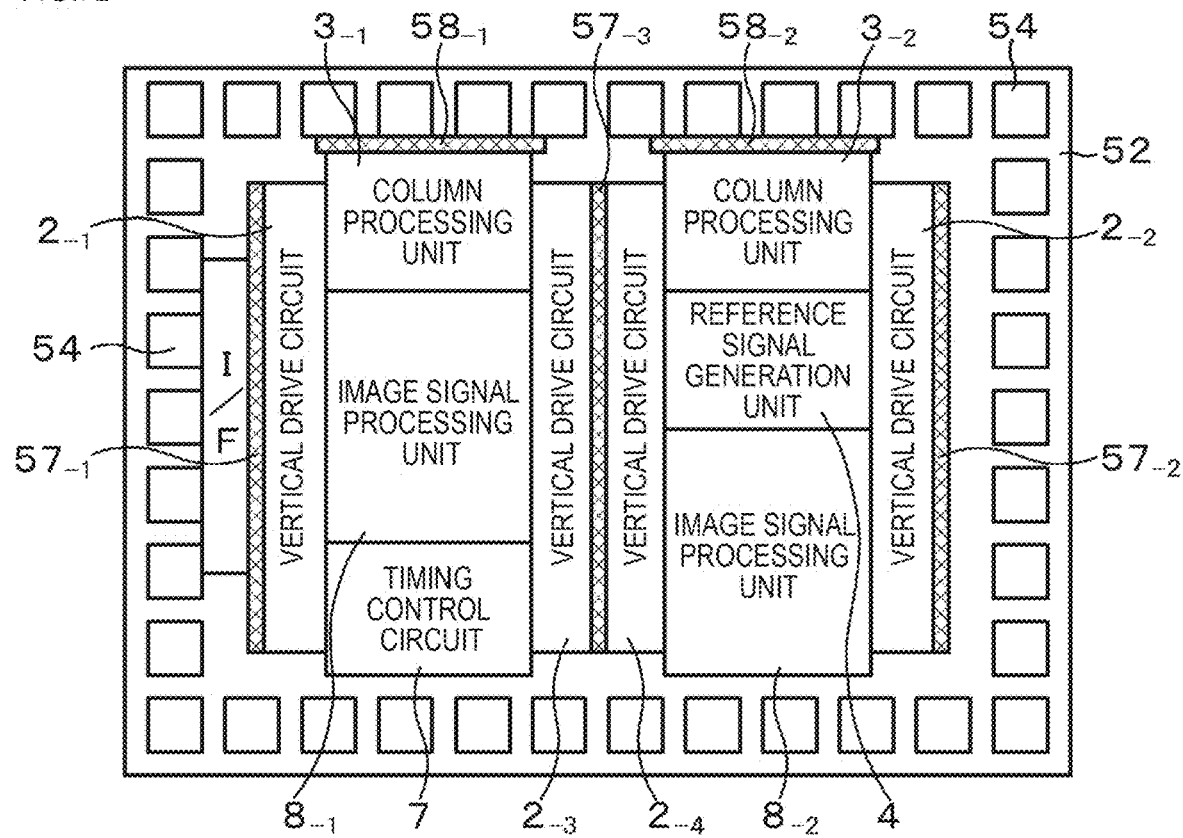
FIG. 7B is a schematic plan view illustrating a floor plan of a second chip according to the first working example.

FIG. 7A is a schematic plan view illustrating a floor plan of the first chip 51 according to a first working example, and FIG. 7B is a schematic plan view illustrating a floor plan of the second chip 52 according to the first working example.

In the first working example, the region of the pixel array unit 1 is divided into four (X=4), and the pixel array unit 1 is composed of four divided array units 1A, 1B, 1C, 1D. As the region of this pixel array unit 1 is divided, the row control lines 11 are divided into four, and are composed of four groups of row control lines 11A, 11B, 11C, 11D. Note that, in FIG. 7A, the directions of the arrows of the row control lines 11A, 11B, 11C, 11D represent the transmission directions of the pixel control signals transferred by the row control lines 11A, 11B, 11C, 11D.

In FIGS. 7A and 7B, connection regions $57_{-1}$, $57_{-2}$, $57_{-3}$ for electrically connecting to the row control lines 11 are provided along the column direction (the vertical direction of the diagrams), between the first chip 51 and the second chip 52, at the both sides and the center portion of the pixel array unit 1. Also, the connection regions $58_{-1}$, $58_{-2}$ for electrically connecting to the column signal line 12 are provided along the row direction (the lateral direction of the diagrams), between the first chip 51 and the second chip 52, at the end portion (the upper end portion of the diagrams) where the column processing units 3 of the pixel array unit 1 are located.

Also, as illustrated in FIG. 7B, four vertical drive circuits $2_{-1}$ to $2_{-4}$ are located in the vicinity of the connection regions $57_{-1}$, $57_{-2}$, $57_{-3}$, corresponding to the respective row control lines 11A, 11B, 11C, 11D divided into four. Specifically, the vertical drive circuit 24 for driving the row control lines 11A is located in the vicinity of the connection region $57_{-1}$ of the left side of the pixel array unit 1, and the vertical drive circuit $2_{-2}$ for driving the row control lines 11D is located in the vicinity of the connection region $57_{-2}$ of the right side of the pixel array unit 1. Also, the vertical drive circuit $2_{-3}$ for driving the row control lines 11B and the vertical drive circuit $2_{-4}$ for driving the row control lines 11CD are located, sandwiching the connection region $57_{-3}$ of the center portion of the pixel array unit 1.

Figure 8:
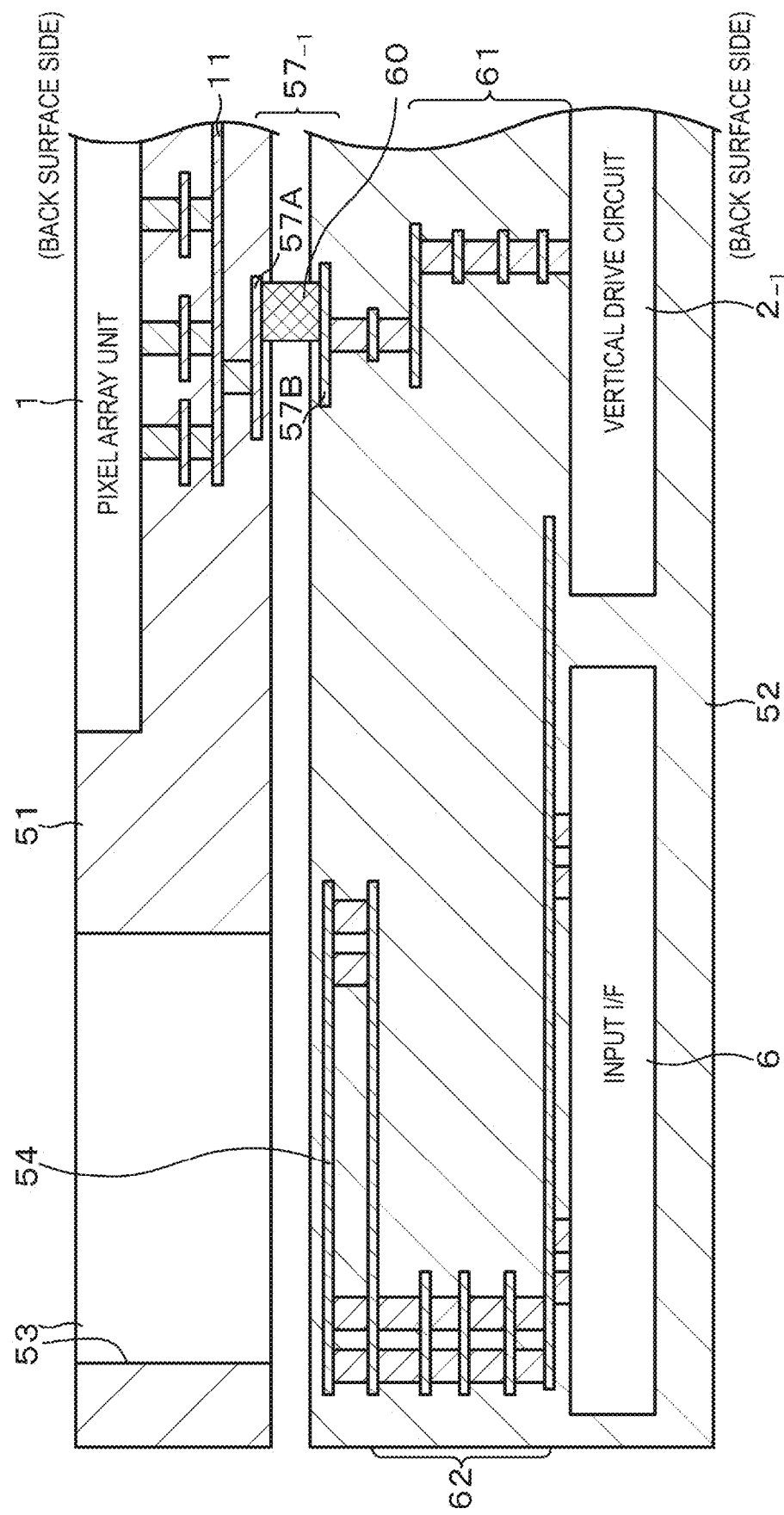
FIG. 8 is a cross-sectional view illustrating a cross-sectional structure of a main part of a first chip and a second chip.

Then, in the connection regions $57_{-1}$, $57_{-2}$, $57_{-3}$ and the connection regions 584, $58_{-2}$, the pixel array unit 1 and the vertical drive circuit 2 are electrically connected for each of the divided array units 1A, 1B, 1C, 1D, by using the electrodes, for example bumps 60 (refer to FIG. 8), located on the substrate front surfaces of the first chip 51 and the second chip 52. Detail will be described by using FIG. 8. FIG. 8 is a cross-sectional view illustrating a cross-sectional structure of a main part of the first chip 51 and the second chip 52. FIG. 8 illustrates the cross-sectional structure around the connection region $57_{-1}$.

As illustrated in FIG. 8, the connection region $57_{-1}$ is composed of a connection electrode 57A of the first chip 51 side and a connection electrode 57B of the second chip 52 side. The connection electrodes 57A, 57B are made of metal material, such as aluminum (Al). Then, in the connection region $57_{-1}$, the connection electrode 57A and the connection electrode 57B are electrically connected by the bump 60. Thereby, the vertical drive circuits 2 ($2_{-1}$ to $2_{-4}$) are electrically connected to the pixel array unit 1 in each of the divided array units 1A, 1B, 1C, 1D, through each line in the wiring layer 61 and the bump 60.

Specifically, each output terminal of the vertical drive circuit $2_{-1}$ is connected to each end of the row control line 11A via each bump 60 in the connection region $57_{-1}$. Each output terminal of the vertical drive circuit $2_{-2}$ is connected to each end of the row control line 11D via each bump 60 in the connection region $57_{-2}$. Each output terminal of the vertical drive circuit $2_{-3}$ is connected to each end of the row control line 11B via each bump 60 in the connection region $57_{-3}$. Each output terminal of the vertical drive circuit $2_{-4}$ is connected to each end of the row control line 11C via each bump 60 in the connection region $57_{-3}$.

In FIG. 8, a pad section 54 is made of metal material, such as aluminum. The pad section 54 is electrically connected to an input-output (I/O) circuit, for example the input interface 6, via each line in the wiring layer 62. Each line in the wiring layer 61 and the wiring layer 62 is composed of metal material, such as copper (Cu).

As described above, the continuity of the pixel arrangement of the pixel array unit 1 is not hindered as illustrated in FIG. 8, by employing the configuration in which the pixel array unit 1 and the vertical drive circuit 2 are electrically connected via the bumps 60 located on the substrate front surfaces of the first chip 51 and the second chip 52. Thus, to speed up the pixel control through the row control lines 11, the line lengths of the row control lines 11 are reduced by dividing the pixel array unit 1 into a plurality of sections in the row direction.

(First Example of Vertical Drive Circuit)

Figure 9:
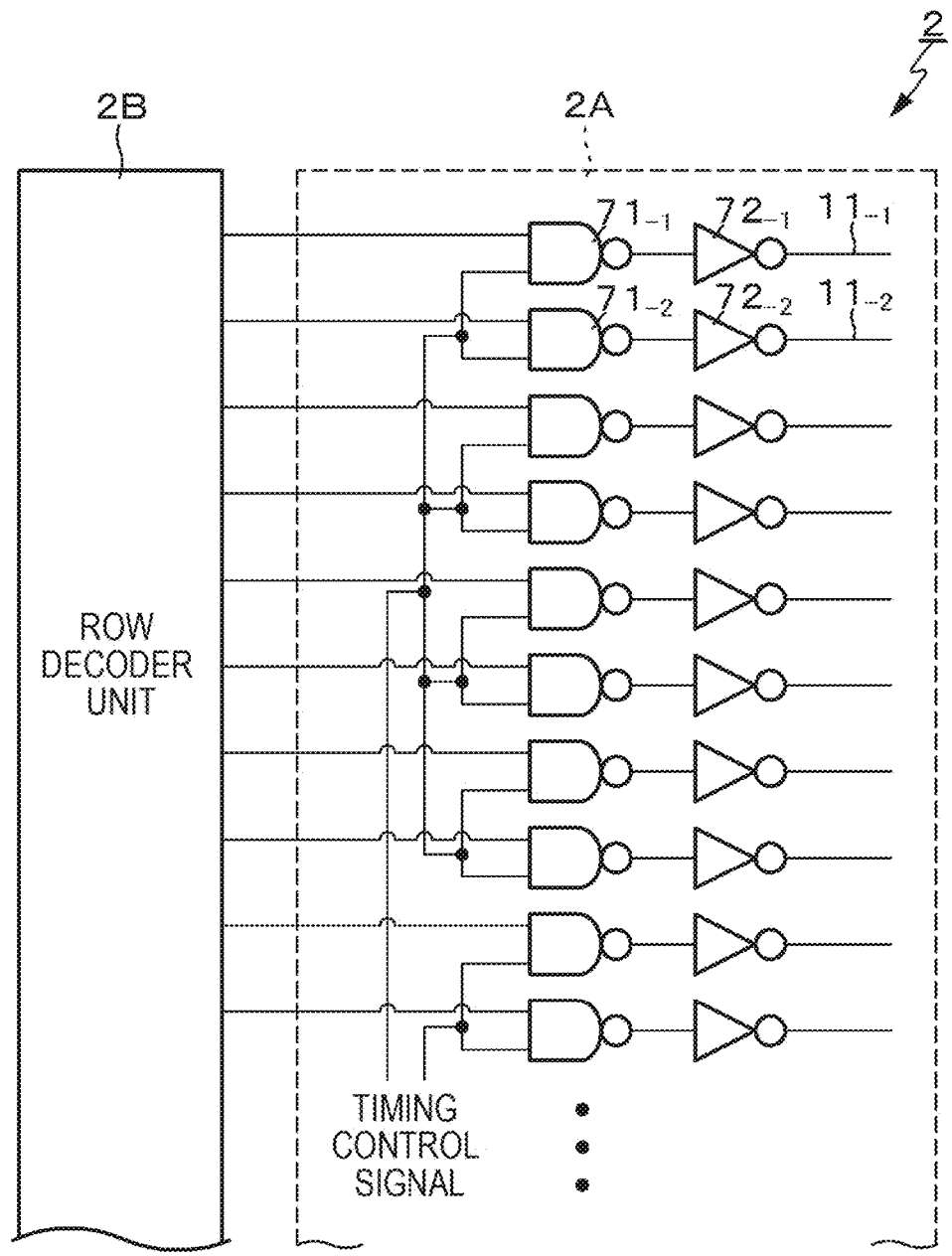
FIG. 9 is a block diagram illustrating a first example of a vertical drive circuit according to the first working example.

FIG. 9 is a block diagram illustrating a first example of the vertical drive circuit 2. As illustrated in FIG. 9, the vertical drive circuit 2 is composed of a row control line driver unit 2A for driving the row control lines 11 ($11_{-1}$ to $11_{-m}$) and a row decoder unit 2B for controlling the row control line driver unit 2A.

The row control line driver unit 2A includes NAND circuits $71_{-1}$ to $71_{-m}$ provided for the respective rows of the pixel array unit 1, and inverter circuits $72_{-1}$ to $72_{-m}$ located at a subsequent stage of the NAND circuits $71_{-1}$ to $71_{-m}$. Decode signals are supplied from the row decoder unit 2B to first input terminals of the NAND circuit $71_{-1}$ to $71_{-m}$. Second input terminals of the NAND circuit $71_{-1}$ to $71_{-m}$ are connected to each other between adjacent two pixel rows. The outputs of the NAND circuits $71_{-1}$ to $71_{-m}$ are polarity-reversed by the inverter circuits $72_{-1}$ to $72_{-m}$ and are supplied to the row control lines $11_{-1}$ to $11_{-m}$ as the pixel control signals.

The drive mode by the pixel control signal includes a rolling shutter mode for driving the row control lines $11_{-1}$ to $11_{-m}$ in order and reading out the signals of the unit pixels 20 in a row-by-row manner, and a global shutter mode for driving the row control lines $11_{-1}$ to $11_{-m}$ simultaneously and reading out the signals of all the pixels at a time. In these drive modes, in-plane synchronicity (synchronicity in the imaging surface) at the time of the global shutter mode is important particularly.

The vertical drive circuit 2 according to the present example is configured such that the timing control signal referred in the circuit operation is delivered to the circuit units corresponding to the respective pixel rows of the row control line driver unit 2A in a clock tree structure, in order to reduce skew (error of timing) of the drive timing of the vertical direction (column direction) at the time of the global shutter operation. Here, "clock tree structure" is a structure that distributes the clock signal (the timing control signal in the present example) in a tree shape. Specifically, as illustrated in FIG. 9, the timing control signal is supplied to the second input terminals of the NAND circuit $71_{-1}$ to $71_{-m}$, with respect to adjacent, for example eight, pixel rows. The timing control signal is supplied from the timing control circuit 7 (refer to FIG. 1).

As described above, the skew of the shutter timing of the pixel array unit 1 of the first chip 51 can be reduced to minimum in both of the vertical and horizontal directions, at the time of the global shutter operation, by employing the configuration that delivers the timing control signal in the clock tree structure to the circuit units corresponding to the respective pixel rows of the row control line driver unit 2A. As a result, in-plane synchronicity of high accuracy is achieved at the time of the global shutter mode.

(Second Example of Vertical Drive Circuit)

The vertical drive circuit 2 according to the first example is to be used in a case of simultaneously driving all the row control lines $11_{-1}$ to $11_{-m}$ in the vertical direction. Specifically, in-plane synchronicity is achieved by delivering the timing control signal in the clock tree structure, at the time of the global shutter operation. This in-plane synchronicity is not a limitation, but the row control lines $11_{-1}$ to $11_{-m}$ can be grouped into a plurality of blocks in the vertical direction (the column direction), to maintain the synchronicity in each block, depending on use purpose.

Figure 10:
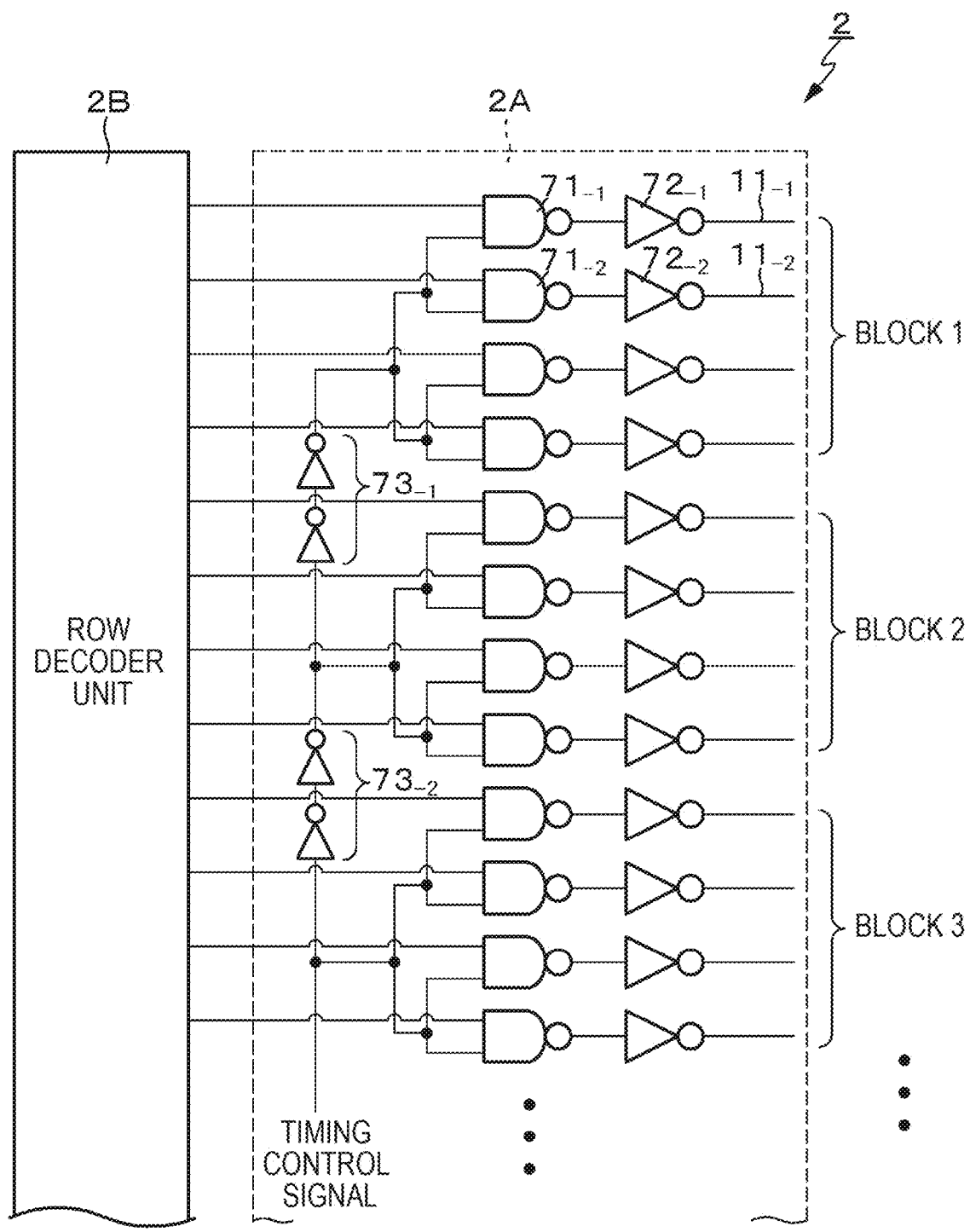
FIG. 10 is a block diagram illustrating a second example of a vertical drive circuit according to the first working example.

The vertical drive circuit 2 according to the second example maintains the synchronicity in each block. FIG. 10 is a block diagram illustrating a second example of the vertical drive circuit 2. As illustrated in FIG. 10, in the vertical drive circuit 2 according to the second example, every four adjacent row control lines $11_{-1}$ to $11_{-m}$ are grouped into a block in the vertical direction (the column direction), for example. Then, buffers $73_{-1}$, $73_{-2}$, . . . are inserted between the blocks to delay the timing control signal by a constant time.

As described above, it is possible to ensure the synchronicity (maintain the synchronicity) for each block, by grouping the row control lines $11_{-1}$ to $11_{-m}$ and delaying the timing control signal between the blocks by a constant time. Also, the operation timing differs in each block, and thus the peak electric current that flows in the vertical drive circuit 2 is reduced.

Note that, in the first example as well, the synchronicity is ensured in each block, like the second example, by providing two or more groups of timing control signals and using the plurality of groups of timing control signals in the control of the adjacent pixel rows alternatingly.

Second Working Example

Figure 11A:
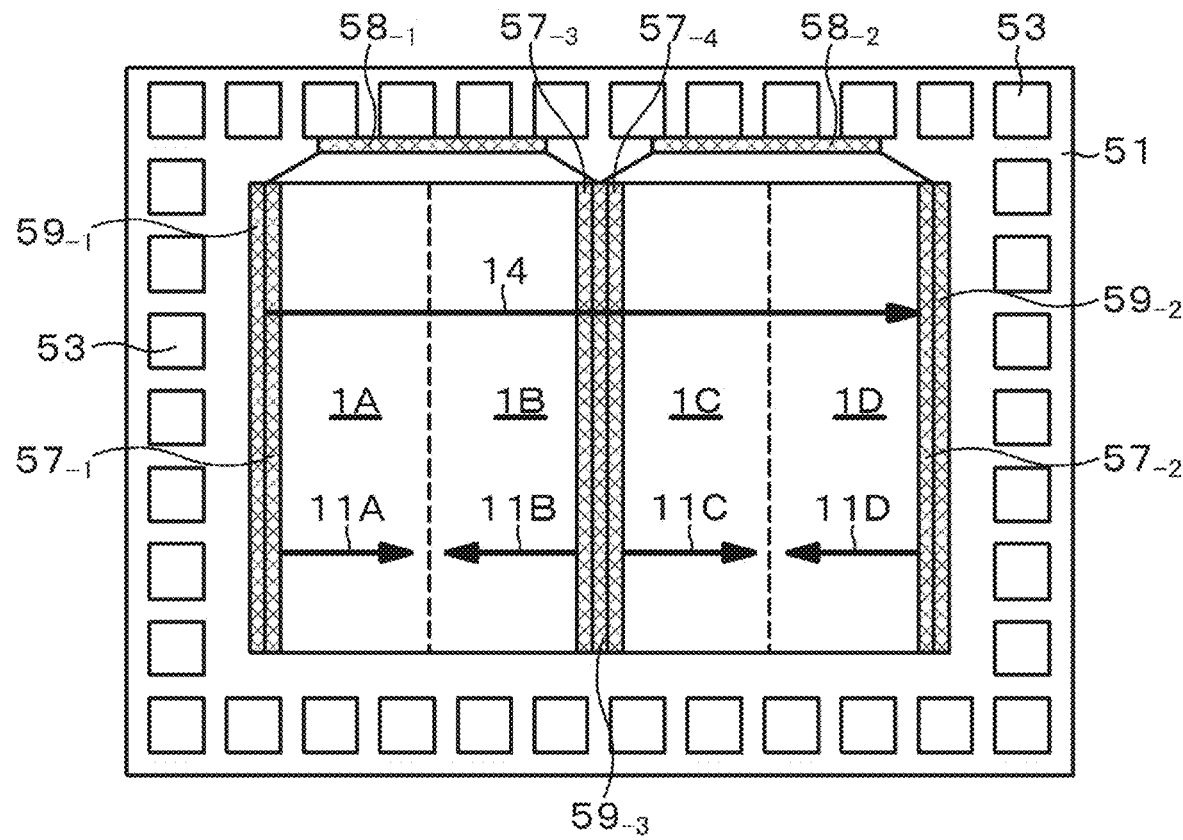
FIG. 11A is a schematic plan view illustrating a floor plan of a first chip according to a second working example.
Figure 11B:
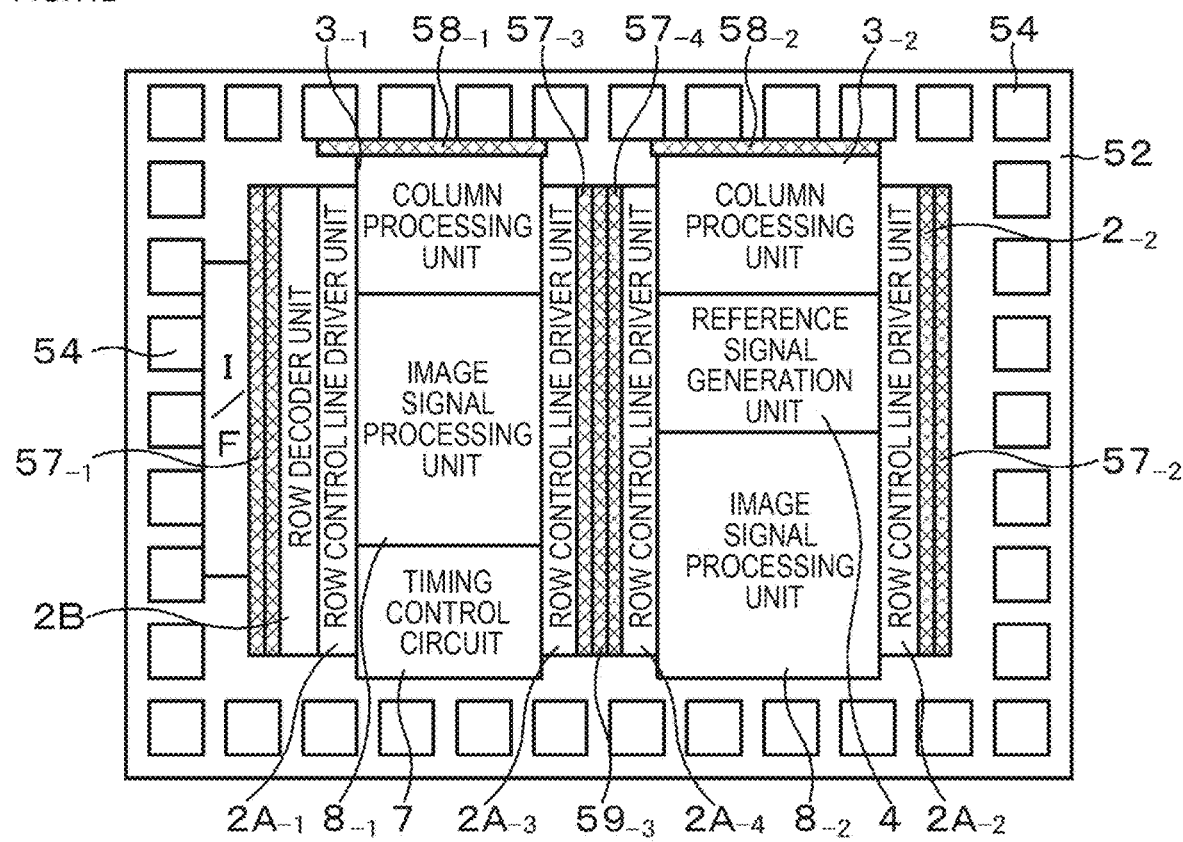
FIG. 11B is a schematic plan view illustrating a floor plan of a second chip according to the second working example.

FIG. 11A is a schematic plan view illustrating a floor plan of the first chip 51 according to a second working example, and FIG. 11B is a schematic plan view illustrating a floor plan of the second chip 52 according to the second working example.

The first working example employs a configuration in which the vertical drive circuits 2 ($2_{-1}$ to $2_{-1}$) composed of the row control line driver unit 2A and the row decoder unit 2B are located corresponding to the respective row control lines 11A, 11B, 11C, 11D divided into four. Specifically, the vertical drive circuit $2_{-1}$ is provided to drive the row control lines 11A, and the vertical drive circuit $2_{-3}$ is provided to drive the row control lines 11B, and the vertical drive circuit $2_{-4}$ is provided to drive the row control lines 11C, and the vertical drive circuit $2_{-2}$ is provided to drive the row control lines 11D.

In contrast, the second working example employs a configuration in which the vertical drive circuit 2 is separated into the row control line driver units 2A and the row decoder unit 2B, and as illustrated in FIG. 11B, one row decoder unit 2B is located at the end portion of the left side of the pixel array unit 1 in common for the row control lines 11A, 11B, 11C, 11D, for example. Then, in FIGS. 11A and 1B, connection regions $59_{-1}$, $59_{-2}$, $59_{-3}$ for electrically connecting to the decode line 14 is provided along the column direction (the vertical direction in the diagrams), between the first chip 51 and the second chip 52, at the both sides and the center portion of the pixel array unit 1.

Also, as illustrated in FIG. 11B, the row control line driver units 2A are located corresponds to the respective row control lines 11A, 11B, 11C, 11D. Specifically, the row control line driver unit $2A_{-1}$ is provided to drive the row control lines 11A, and the row control line driver unit $2A_{-3}$ is provided to drive the row control lines 11B. Also, the row control line driver unit $2A_{-1}$ is provided to drive the row control lines 11C, and the row control line driver unit $2A_{-2}$ is provided to drive the row control lines 11D.

Figure 12:
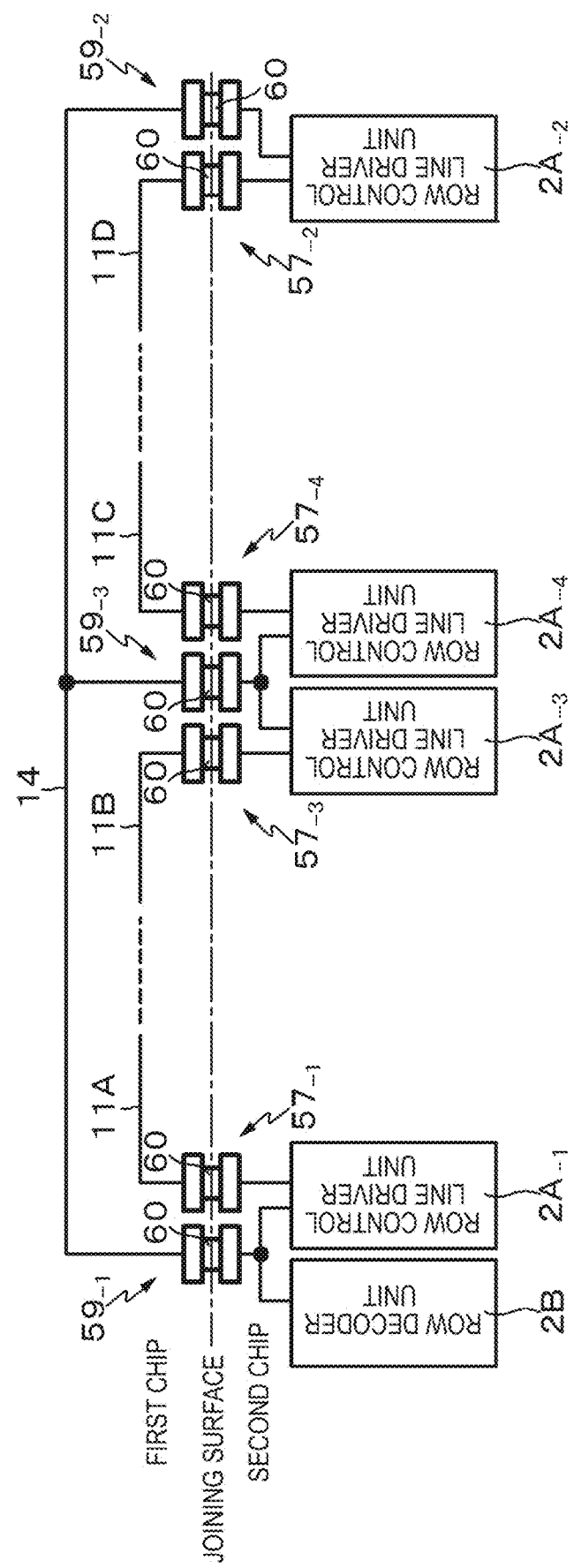
FIG. 12 is a schematic view illustrating an example of a configuration of a joint portion between a first chip and a second chip in the second working example.

FIG. 12 is a schematic view illustrating an example of a configuration of joint portions between the first chip 51 and the second chip 52 in the second working example. As illustrated in FIG. 12, the row decoder unit 2B provided in the second chip 52 and the decode line 14 arranged in the first chip 51 are electrically connected by the bump 60 in the connection region $59_{-1}$. Also, the decode line 14 is electrically connected to the row control line driver units $2A_{-3}$, $2A_{-1}$ by the bump 60 in the connection region $59_{-3}$, and further is electrically connected to the row control line driver unit $2A_{-2}$ by the bump 60 in the connection region $59_{-2}$.

Figure 13:
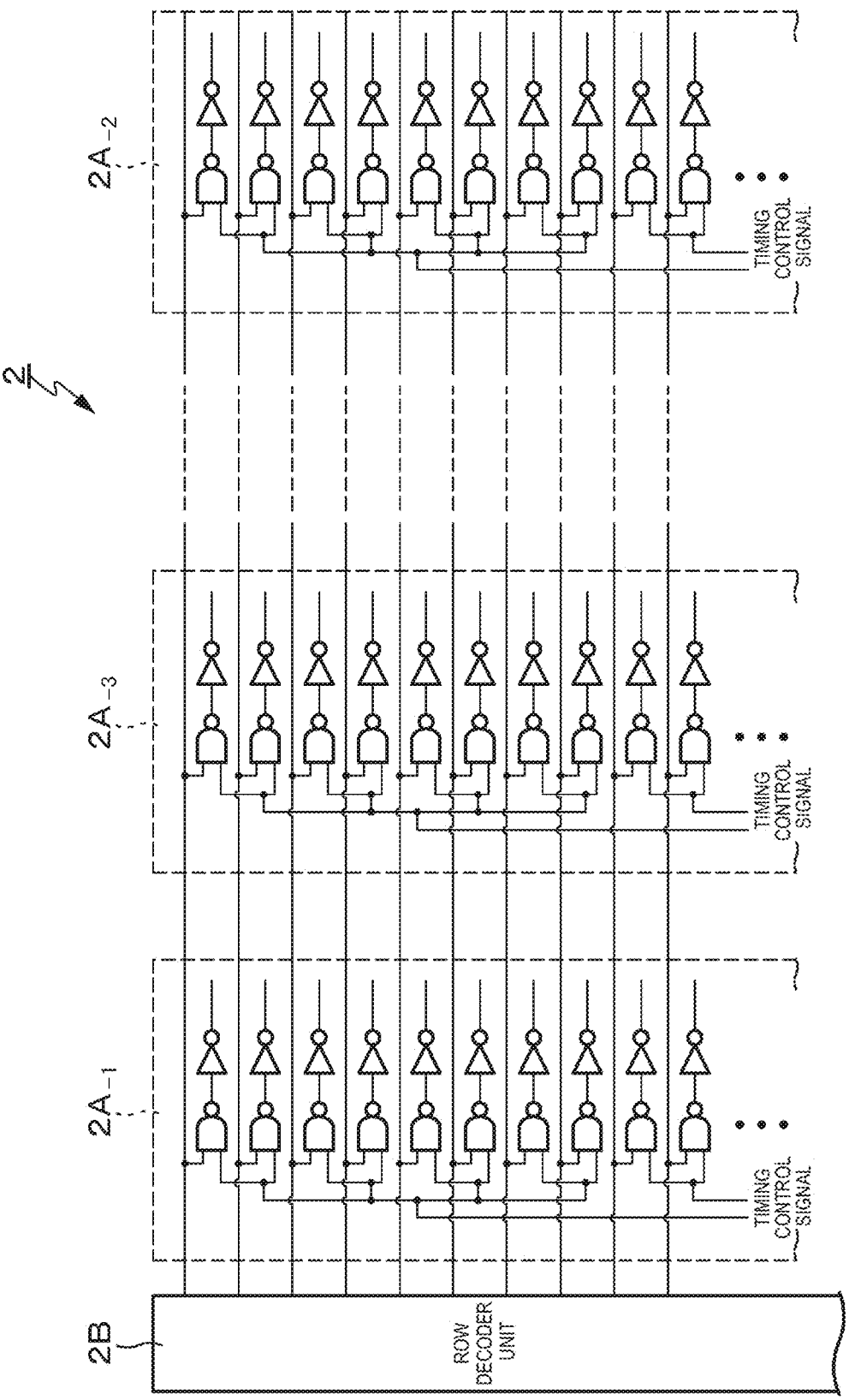
FIG. 13 is a block diagram illustrating an example of a configuration of a vertical drive circuit according to the second working example.

Thereby, the decode signal output from the row decoder unit 2B is directly supplied to the row control line driver unit $2A_{-1}$ adjacent to the row decoder unit 2B, and is transmitted by the decode line 14 and supplied to the row control line driver units $2A_{-3}$, $2A_{-1}$ and the row control line driver unit $2A_{-2}$. The electrical connection between the row control line driver units 2A ($2A_{-1}$ to $2A_{-1}$) and the row control lines 11 (11A to 11D) is the same as the electrical connection between the vertical drive circuits 2 ($2_{-1}$ to $2_{-4}$) and the row control lines 11 (11A to 11D) in the first working example. FIG. 13 illustrates an example of the configuration of the vertical drive circuit 2 according to the second working example.

According to the second working example, the row decoder unit 2B is provided in common for the row control lines 11A, 11B, 11C, 11D, and the row control line driver units 2A are provided corresponding to the respective row control lines 11A, 11B, 11C, 11D, and thus the layout area of the second chip 52 can be reduced as compared with the first working example. Specifically, in the first working example, the row decoder units 2B are also provided corresponding to the respective row control lines 11A, 11B, 11C, 11D, and thus in the second working example in which one row decoder unit is provided in common for the row control lines 11A, 11B, 11C, 11D, the layout area is reduced by the area of three row decoder units as compared with the first working example.

Third Working Example

Figure 14:
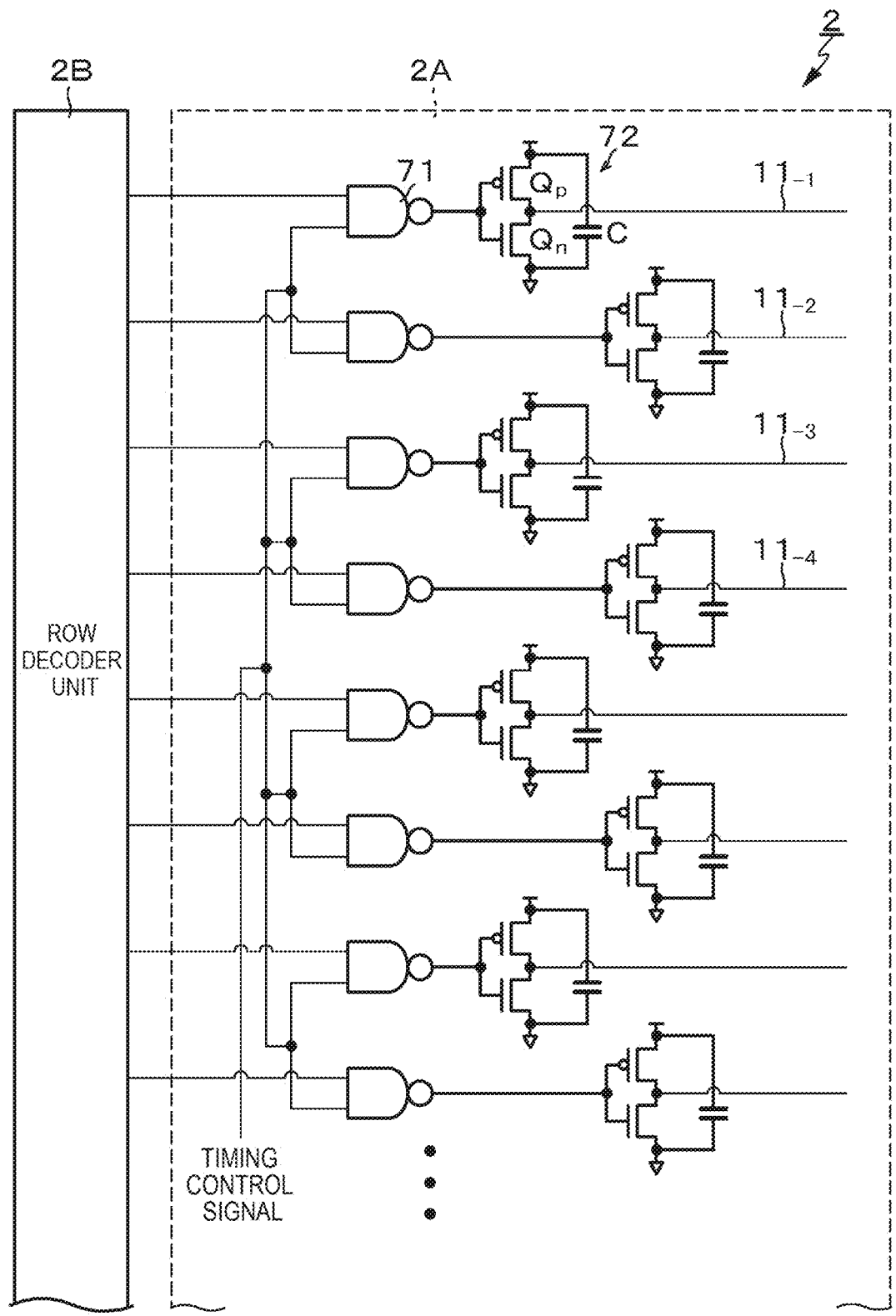
FIG. 14 is a circuit diagram illustrating an example of a configuration of a vertical drive circuit according to a third working example.

FIG. 14 is a circuit diagram illustrating an example of the configuration of the vertical drive circuit 2 according to a third working example. In FIG. 14, the circuit section corresponding to each pixel row of the vertical drive circuit 2 is composed of a NAND circuit 71 ($71_{-1}$ to $71_{-m}$), and an inverter circuit 72 ($72_{-1}$ to $72_{-m}$) located at the subsequent stage.

The inverter circuit 72 that configures the output stage of each pixel row of the vertical drive circuit 2 has a CMOS inverter configuration composed of a P-channel MOS transistor Qp and an N-channel MOS transistor Qn which are connected in series between a high electric potential side power supply and a low electric potential side power supply and whose gate electrodes are connected to form a common input terminal. Then, a drain common connection node of the MOS transistor Qp and the MOS transistor Qn is an output terminal of the inverter circuit 72, and one end of the row control line 11 ($11_{-1}$ to $11_{-m}$) is connected to this output terminal.

A capacitive element C is connected in the vicinity of the row control line driver unit 2A of the vertical drive circuit 2, for example at the output stage of each pixel row of the vertical drive circuit 2, that is, between the high electric potential side power supply and the low electric potential side power supply (for example, the ground) of the inverter circuit 72. This capacitive element C is a stabilizing capacity for stabilizing the power-supply voltage.

By the way, at the time of global shutter operation, the large parasitic capacitance of the row control lines 11 ($11_{-1}$ to $11_{-m}$) are charged and discharged at a high speed, and thereby large electric current flows instantaneously, making the power-supply voltage of the internal power supply unstable (for example, noise generation). Then, the operation becomes unstable at the time of global shutter, if the power-supply voltage becomes unstable due to the noise generation for example.

In contrast, the vertical drive circuit 2 according to the third working example includes the capacitive element C connected between the high electric potential side power supply and the low electric potential side power supply in the vicinity of the row control line driver unit 2A, and thus even if the large electric current flows instantaneously, the power-supply voltage can be stabilized by absorbing the noise for example. Thereby, the operation at the time of global shutter is stabilized. The technology of the power supply stabilization by the capacitive element C can be applied to the vertical drive circuit 2 according to the first working example and the second working example.

Variant Example

In the above, the technology of the present disclosure has been described on the basis of the preferable embodiments, but the present disclosure is not limited to the embodiments. The configuration and the structure of the solid state image sensor described in the embodiments are just illustration, and can be changed as appropriate. For example, the above embodiment has been described, taking an example of a case in which the region of the pixel array unit 1 is divided into four, but the number of divisions is not limited to four. As the number of divisions becomes larger, the line length of each row control line 11 of the divided array unit is made shorter, and along with it, the time constant decided by the line resistance and the parasitic capacitance is made smaller, and thus speeding up of the pixel control is achieved.

Also, the above embodiment has been described taking an example of a case in which application is the solid state image sensor, for example the CMOS image sensor, but is not limited to this exemplary application. That is, the technology of the present disclosure is generally applicable to a semiconductor device such as a memory device, in which the first semiconductor substrate provided with the circuit unit in which the unit circuits are located in a matrix form and the second semiconductor substrate provided with the drive unit for driving the unit circuits are staked, with the substrate surfaces on which the wiring layer are formed facing each other.

In this case, in the semiconductor device of the present disclosure, the first semiconductor substrate provided with the circuit unit in which the unit circuits are arranged in a matrix form and the second semiconductor substrate provided with the drive unit for driving the unit circuits are stacked, with the substrate surfaces on which the wiring layers are formed facing each other. Then, the circuit unit is composed of a plurality of divided circuit units, and the drive units are provided corresponding to the respective divided circuit units, and the electrical connection is established in each divided circuit unit, through the electrodes located on the first surfaces of the first semiconductor substrate and the second semiconductor substrate, between the circuit unit and the drive unit.

<Electronic Device>

The CMOS image sensor according to the above embodiment can be used as an image capturing unit (image acquiring unit) in electronic devices, such as an image capturing device such as a digital still camera and a video camera, a portable terminal device that has an image capturing function such as a mobile phone, and a copy machine that uses a solid state image sensor in an image reading unit. Note that the above module form provided in the electronic device, that is, a camera module is used as the image capturing device in some cases.

[Image Capturing Device]

Figure 15A:
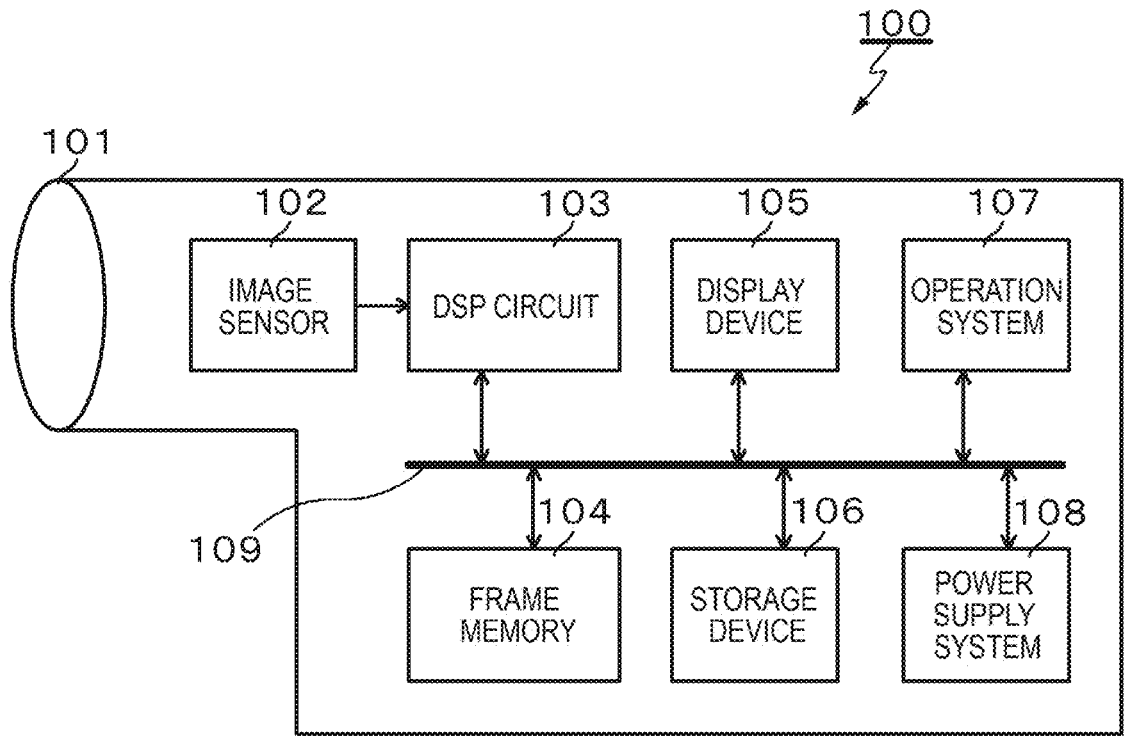
FIG. 15A is a block diagram illustrating an exemplary configuration of an image capturing device of the present disclosure.

FIG. 15A is a block diagram illustrating an exemplary configuration of the image capturing device of the present disclosure. As illustrated in FIG. 15A, the image capturing device 100 of the present disclosure includes an optical system that includes a lens group 101 or the like, an image sensor 102, a DSP circuit 103 which is a camera signal processing unit, a frame memory 104, a display device 105, a record device 106, an operation system 107, and a power supply system 108. Then, the DSP circuit 103, the frame memory 104, the display device 105, the record device 106, the operation system 107, and the power supply system 108 are connected to each other via a bus line 109.

The lens group 101 accepts an incoming light (image light) from an imaged object and forms an image on an imaging surface of the image sensor 102. The image sensor 102 converts the light amount of the incoming light by which an image is formed on the imaging surface by the lens group 101, to the electrical signal in each pixel and outputs it as a pixel signal.

The display device 105 is a panel display device such as a liquid crystal display device and an organic electro luminescence (EL) display device, and displays a moving image or a still image captured by the image sensor 102. The record device 106 records the moving image or the still image captured by the image sensor 102, in a recording medium such as a memory card, a video tape, and a digital versatile disk (DVD).

The operation system 107 issues an operation command with regard to various functions of the present image capturing device 100, under the operation by the user. The power supply system 108 supplies various types of power supplies, which are operation power supplies of the DSP circuit 103, the frame memory 104, the display device 105, the record device 106, and the operation system 107, to these supply targets, as appropriate.

This image capturing device 100 can be applied to a video camera and a digital still camera, and further to a camera module for a mobile device such as a mobile phone. Then, this image capturing device 100 can use the CMOS image sensor according to the aforementioned embodiment, which is capable of speeding up of the pixel control, as the image sensor 102. Thereby, the synchronicity in the surface of the shutter operation can be maintained, in the application that needs the high speed global shutter operation, for example.

[Distance Measuring Device]

The CMOS image sensor according to the aforementioned embodiment can be applied to a distance measuring device that measures the distance to an imaged object (measurement object) for example, instead of the video camera, the digital still camera, or the camera module for the mobile device such as the mobile phone. As the distance measuring device, there is known a three-dimensional distance image sensor of a TOF (Time Of Flight) method that measures the distance to the imaged object by measuring the time (round-trip time to the imaged object) until the light radiated and reflected on the imaged object returns, for example.

Figure 15B:
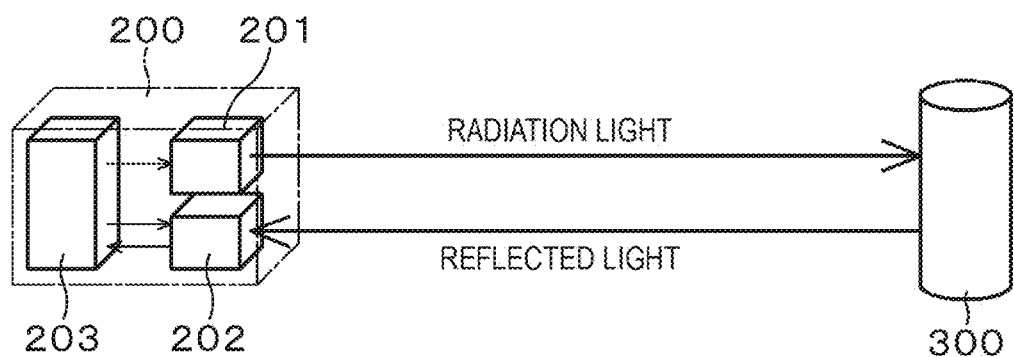
FIG. 15B is a schematic view illustrating an example of a configuration of a distance measuring device of a TOF method.

FIG. 15B is a schematic view illustrating an example of a configuration of the distance measuring device of the TOF method. As illustrated in FIG. 15B, the distance measuring device 200 according to the present example includes a light source 201, a light reception sensor 202, and a control unit 203, which are located closely.

The light source 201 radiates laser light to an imaged object (measurement object) 300, for example. The light reception sensor 202 is configured with the CMOS image sensor according to the aforementioned embodiment, and receives a reflected light (reflected signal) from the imaged object 300 based on the radiation light (radiation signal) from the light source 201. The control unit 203 is configured with a microcomputer or the like, for example, and performs a process for controlling the operation of the light source 201 and the light reception sensor 202. The control unit 203 performs a process for calculating the distance to the imaged object 300, on the basis of the detected signal of the light reception sensor 202, in addition to the process for controlling the light source 201 and the light reception sensor 202.

Figure 16:
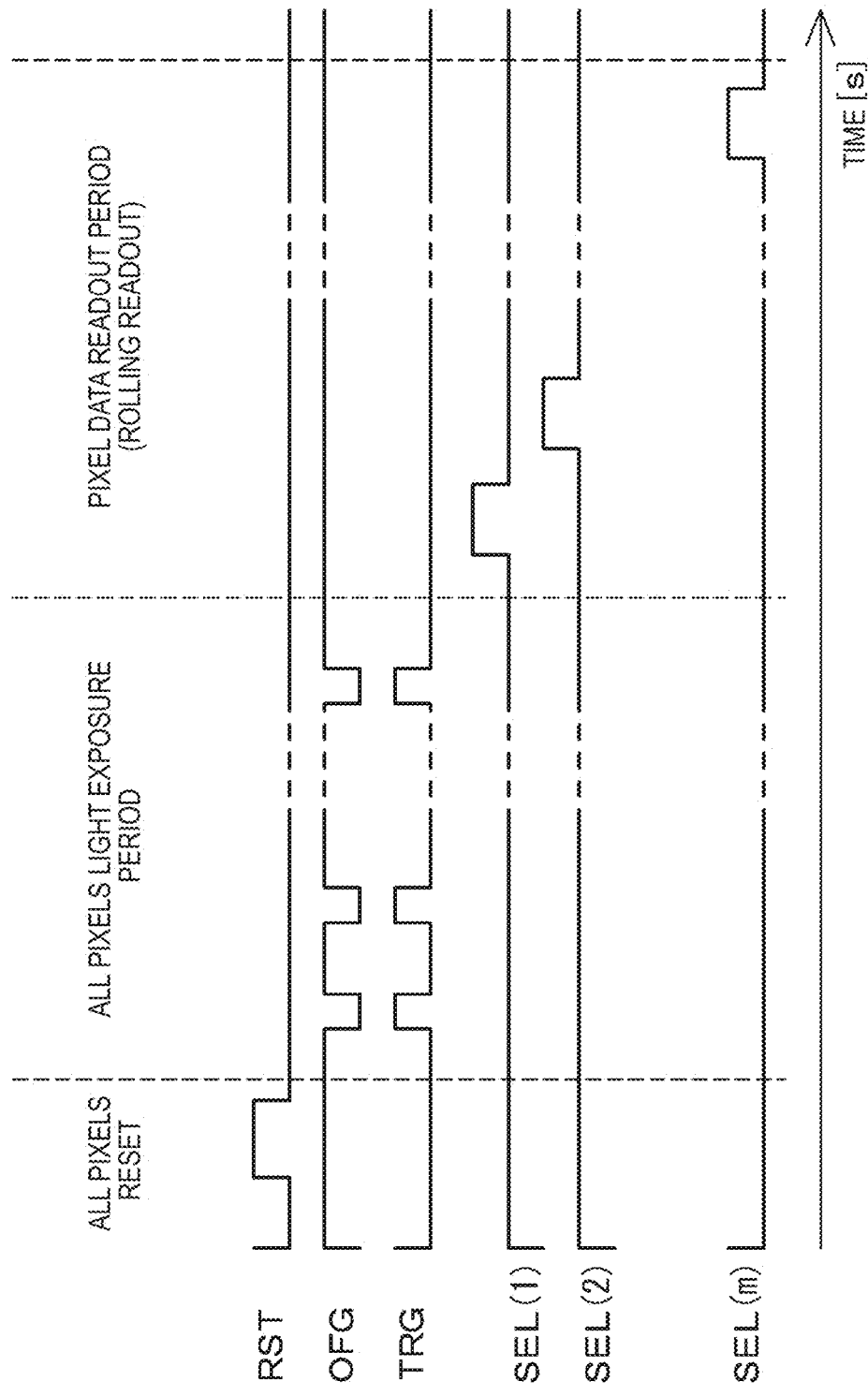
FIG. 16 is a timing chart illustrating a timing relationship of a pixel control signal when a distance measuring device of a TOF method performs TOF operation (distance measurement operation).

In the distance measuring device 200, the pixel configuration illustrated in FIG. 3A, that is, the pixel configuration including the electric charge discharge transistor 27 is preferable to be used as the unit pixel 20 of the CMOS image sensor used as the light reception sensor 202, as is obvious from the operation description described later. FIG. 16 illustrates a timing relationship of pixel control signals, when the TOF operation (distance measurement operation) is performed in the distance measuring device 200 of the TOF method.

Figure 17:
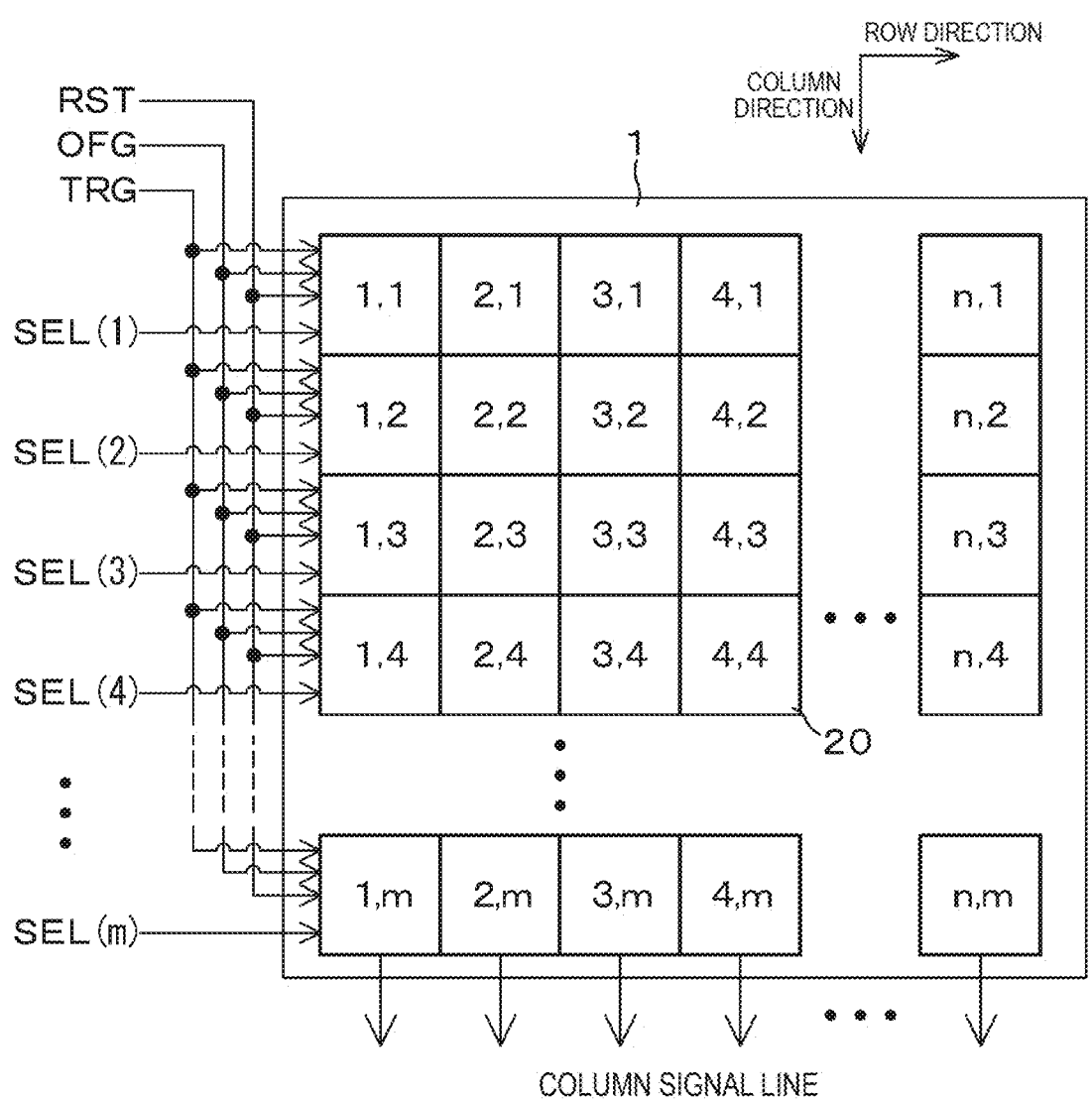
FIG. 17 is a diagram illustrating a pixel array of a pixel array unit which is used in description of TOF operation.

Also, FIG. 17 illustrates a pixel array of the pixel array unit 1 that is used in the description of the TOF operation. FIG. 17 illustrates the pixel array of m rows and n columns. In this example, a reset signal RST, an electric charge discharge signal OFG, and a transfer signal TRG, among the pixel control signals, are commonly supplied to all the pixels 20 through the respective pixel rows. This supply example of the pixel control signals means a logical supply example corresponding to the timing chart of FIG. 16, and physically the pixel control signals are supplied in the respective divided array units of the pixel array unit 1 from the independent row control line driver unit 2A in the first working example to the third working example.

Note that, the row decoder unit 2B in the vertical drive circuit 2 is provided to deal with various light exposure modes, but the row decoder unit 2B is unnecessary in the case of the exemplary operation of the reset signal RST, the electric charge discharge signal OFG, and the transfer signal TRG in the timing chart of FIG. 16. Hence, in the vertical drive circuit 2 illustrated in FIGS. 9 and 10, a state in which all of the outputs of the row decoder unit 2B are at high level is assumed as a premise. As illustrated in FIG. 13, this is not a limitation when the row control line driver unit 2A is divided.

In the following, an exemplary operation based on the timing chart of FIG. 16 will be described, by using the pixel circuit illustrated in FIG. 3A.

In the timing chart of FIG. 16, first, the high level reset signal RST of a pulse form is supplied, and the reset transistor 24 becomes conductive. Thereby, the FD sections 22 of all the pixels 20 of the pixel array illustrated in FIG. 17 are reset (all pixel reset period). Next, in all pixel light exposure period, the initial logical state of the electric charge discharge signal OFG is high level, and the initial logical state of the transfer signal TRG is low level. In this initial state, the photo diode 21 is reset.

The logical states of the electric charge discharge signal OFG and the transfer signal TRG are inverted from this initial state, and thereby the light exposure is performed. Light exposure of the TOF operation will be described later. After the light exposure is completed, the row decoder unit 2B operates to activate (to high level) the selection signal SEL(1) of the first row to the selection signal SEL(m) of the m-th row in order, so that the pixel signal accumulated in the FD section 22 of each pixel 20 is read out from each pixel row.

Figure 18:
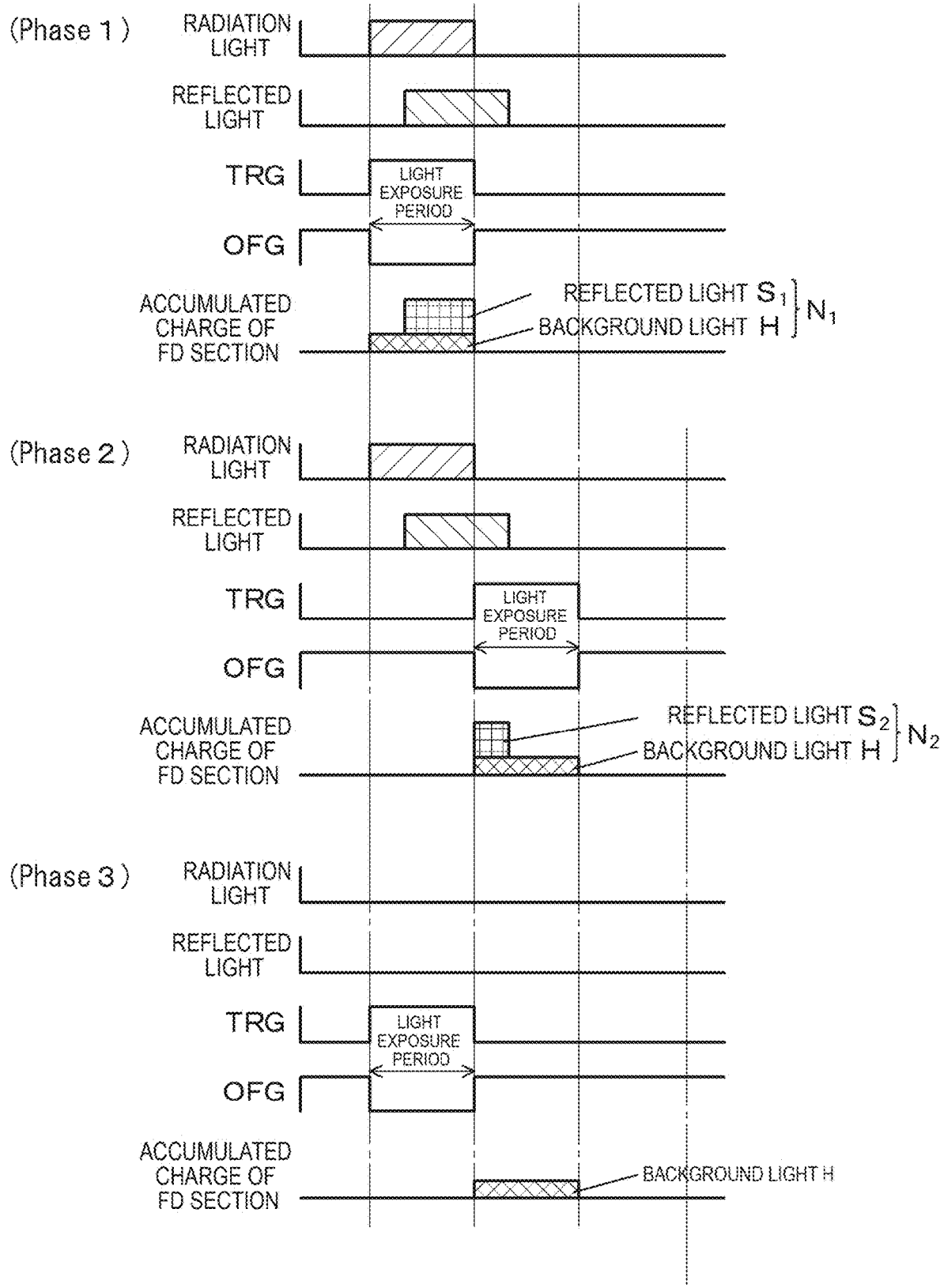
FIG. 18 is an explanatory diagram of exemplary operation of TOF operation.

Next, an exemplary operation of the TOF operation will be described by using FIG. 18. FIG. 18 is an explanatory diagram of the exemplary operation of the TOF operation. In an application such as the distance measuring device of the TOF method, high speed improves measurement accuracy, and thus speeding up of the shutter operation is eagerly required. In the timing chart of FIG. 16, the electric charge discharge signal OFG and the transfer signal TRG are the pixel control signals for administering the shutter operation which needs to be sped up.

In the distance measuring device 200 of the TOF method illustrated in FIG. 15B, the light radiated from the light source 201 provided in the vicinity of the light reception sensor 202 configured with the CMOS image sensor according to the aforementioned embodiment is reflected on the imaged object 300 and reaches the light reception sensor 202.

(Phase 1)

With regard to the unit pixel 20, the transfer signal TRG is shifted to high level, and the electric charge discharge signal OFG is shifted to low level, simultaneously with the radiation light (or after an offset time), under the control by the control unit 203. This period is the light exposure period. During the light exposure period, the signal $S_1$ of the reflected light during the period of the transfer signal TRG pulse and the signal H of the background light during the period of the transfer signal TRG pulse, among the reflected lights from the imaged object 300, are photoelectrically converted and accumulated in the FD section 22.

(Phase 2)

Phase 2 is operation similar to phase 1, and the pulse width of the transfer signal TRG is the same as phase 1. Note that the operation timing has an offset of a pulse width of the radiation light. Then, a signal $S_2$ of reflected light and a signal H of background light are accumulated in the FD section 22.

(Phase 3)

The radiation light from the light source 201 is not radiated on the imaged object 300, and operation similar to phase 1 is performed.

(a) The operation of phase 3 is executed p times, and the electric charge (signal H of background light×p) accumulated in the FD section 22 is read out from all the pixels by rolling readout. This read data of all the pixels is stored in a memory connected to the outside.

(b) After the operation of phase 1 is executed p times, the electric charge ((signal H of background light+signal $S_1$ of reflected light)×p) accumulated in the FD section 22 is read out from all the pixels. Then, from this read data, the data stored in the memory in (a) is subtracted for each pixel, and the result (signal $S_1$ of reflected light×p) is stored in the memory.

(c) After executing phase 2 p times, (signal $S_2$ of reflected light×p) is stored in the memory, in the same manner as (a).

(d) When the pulse width of radiation light is W [s], the measurement distance D [m] is calculated from next equation (1).

$$D=(C \cdot W \cdot \Delta\varphi)/2 \qquad (1)$$

Here, C is the light speed. Also, $\Delta\varphi$ is calculated by next equation (2).

$$\Delta\varphi=S_2/(S_1+S_2) \qquad (2)$$

Additionally, the present technology may also be configured as below.

[1]

A solid state image sensor including:
  a first semiconductor substrate provided with at least a pixel array unit in which pixels that perform photoelectric conversion are arranged in a matrix form; and
  a second semiconductor substrate provided with at least a control circuit unit that drives the pixels,
  in which the first semiconductor substrate and the second semiconductor substrate are stacked, with first surfaces on which wiring layers are formed facing each other,
  the pixel array unit is composed of a plurality of divided array units,
  the control circuit unit is provided corresponding to each of the plurality of divided array units, and
  electrical connection is established in each of the divided array units, through an electrode located on each of the first surfaces of the first semiconductor substrate and the second semiconductor substrate, between the pixel array unit and the control circuit unit.

[2]

The solid state image sensor according to [1], in which
  the first semiconductor substrate is configured to accept an incoming light from a second surface side opposite to the first surface, into the plurality of pixels.

[3]

The solid state image sensor according to [1] or [2], in which
  pixel control lines are arranged for respective pixel rows in the pixel array unit, and
  the pixel control lines are divided, corresponding to the plurality of divided array units.

[4]

The solid state image sensor according to any one of [1] to [3], in which
  the control circuit unit includes a control line driver unit that drives pixel control lines arranged for respective pixel rows in the pixel array unit, and
  the control line driver unit delivers a timing control signal referred in circuit operation, to circuit units corresponding to the respective pixel rows, in a clock tree structure.

[5]
The solid state image sensor according to [4], in which
the pixel control lines are grouped into blocks including a plurality of pixel control lines, and
the control line driver unit delivers the timing control signal to the pixel control lines, with a constant delay between the blocks.

[6]
The solid state image sensor according to [4] or [5], in which
the control circuit unit includes a decoder unit that supplies a decode signal to the control line driver unit,
the control line driver unit is provided for each of the plurality of divided array units, and
one decoder unit is provided commonly for the plurality of divided array units.

[7]
The solid state image sensor according to any one of [4] to [6], in which
the control line driver unit includes a capacitive element for power supply stabilization that is connected between a high electric potential side power supply and a low electric potential side power supply of an output stage.

[8]
A semiconductor device including:
a first semiconductor substrate provided with a circuit unit in which unit circuits are arranged in a matrix form; and
a second semiconductor substrate provided with a drive unit that drives the unit circuits,
in which the first semiconductor substrate and the second semiconductor substrate are stacked, with first surfaces on which wiring layers are formed facing each other,
the circuit unit is composed of a plurality of divided circuit units,
the drive unit is provided corresponding to each of the plurality of divided circuit units, and
electrical connection is established in each of the divided circuit units, through an electrode located on each of the first surfaces of the first semiconductor substrate and the second semiconductor substrate, between the circuit unit and the drive unit.

[9]
An electronic device including
a solid state image sensor including
a first semiconductor substrate provided with at least a pixel array unit in which pixels that perform photoelectric conversion are arranged in a matrix form, and
a second semiconductor substrate provided with at least a control circuit unit that drives the pixels,
in which the first semiconductor substrate and the second semiconductor substrate are stacked, with first surfaces on which wiring layers are formed facing each other,
the pixel array unit is composed of a plurality of divided array units,
the control circuit unit is provided corresponding to each of the plurality of divided array units, and
electrical connection is established in each of the divided array units, through an electrode located on each of the first surfaces of the first semiconductor substrate and the second semiconductor substrate, between the pixel array unit and the control circuit unit.

[10]
The electronic device according to [10], further including:
a light source that radiates a light on an imaged object,
in which a reflected light from the imaged object based on a radiation light from the light source is received by the solid state image sensor, and
a distance to the imaged object is measured on the basis of a detected signal of the solid state image sensor.

REFERENCE SIGNS LIST 1 pixel array unit
1A, 1B, 1C, 1D division pixel array unit
2 ($2_{-1}$ to $2_{-4}$) vertical drive circuit (row scan circuit)
2A ($2A_{-1}$ to $2A_{-4}$) row control line driver unit
2B row decoder unit
3 column processing unit
4 reference signal generation unit
5 horizontal scanning circuit (column scanning circuit)
7 timing control circuit
8 image signal processing unit
10 CMOS image sensor
11 ($11_{-1}$ to $11_{-m}$), 11A, 11B, 11C, 11D row control line
12 ($12_{-1}$ to $12_{-n}$) column signal line
20 unit pixel (pixel circuit)
21 photo diode (photoelectric conversion element)
22 electric charge voltage conversion section (FD section)
23 transfer transistor (transfer gate unit)
24 reset transistor
25 amplification transistor
26 selection transistor
27 electric charge discharge transistor
31 comparator circuit
32 counter circuit
33 switch circuit
34 memory circuit
51 first chip (first semiconductor substrate)
52 second chip (second semiconductor substrate)
60 bump (electrode)

The invention claimed is:
1. An imaging device comprising:
a first substrate including a pixel array unit which has a first pixel array, a second pixel array, and a third pixel array;
a second substrate bonded to the first substrate, the second substrate including a first pixel row control circuit, a second pixel row control circuit, a third pixel row control circuit, and a column processing unit wherein:
the first pixel array is electrically connected to the first pixel row control circuit, the second pixel array is electrically connected to the second pixel row control circuit, and the third pixel array is electrically connected to the third pixel row control circuit;
wherein: each of the first pixel array, the second pixel array and the third pixel array comprises a plurality of pixels arranged in a plurality of columns and a plurality of rows;
wherein: each of the first pixel row control circuit, the second pixel row control circuit and the third pixel row control circuit is configured to control a respective plurality of rows of pixels of the first pixel array, the second pixel array and the third pixel array;
wherein: the first pixel row control circuit, the second pixel row control circuit, and the third pixel row control circuit are physically separated from one another on the second substrate; and
wherein: the column processing unit is distributed among the first pixel row control circuit and the second pixel row control circuit.

2. The imaging device of claim 1, further comprising:
a first connection region configured to electrically connect the first pixel array and the first pixel row control circuit;
a second connection region configured to electrically connect the second pixel array and the second pixel row control circuit;
a third connection region configured to electrically connect the third pixel array and the third pixel row control circuit, wherein
the first substrate comprises a first surface facing the second substrate; and
wherein: the pixel array unit comprises a first edge and a second edge spaced apart from the first edge along a first direction parallel to a row direction of the pixel array unit.

3. The imaging device of claim 2, wherein:
the second connection region is disposed closer to a midpoint between the first and second edges than to the first edge or to the second edge.

4. The imaging device of claim 3, wherein:
the second connection region is disposed at the midpoint.

5. The imaging device of claim 2, wherein:
the second connection region is disposed between the first connection region and the third connection region.

6. The imaging device of claim 5, wherein:
the third connection region is disposed between the second connection region and the second edge.

7. The imaging device of claim 2, wherein:
the first connection region is disposed between the second connection region and the first edge.

8. The imaging device of claim 2, wherein:
the first pixel array, the second pixel array and the third pixel array are arranged along the first direction, and the second pixel array is between the first and third pixel arrays.

9. The imaging device of claim 2, wherein:
the first connection region comprises one or more bumps.

10. The imaging device of claim 1, wherein:
the first pixel array comprises a first group of control lines, and
the third pixel array comprises a third group of control lines.

11. The imaging device of claim 10, wherein the first pixel row control circuit is configured to control the first group of control lines, and the third pixel row control circuit is configured to control the third group of control lines.

12. The imaging device of claim 1, wherein the imaging device is configured to measure a distance of an object from the imaging device.

13. The imaging device of claim 12, further comprising a light source, and wherein the first pixel array and the second pixel array are positioned to receive light reflected by the object.

14. The imaging device of claim 13, further comprising circuitry configured to determine the distance of the object based on signals generated by the first pixel array and the second pixel array that correspond to detecting the reflected light.

* * * * *